(12) United States Patent
Basler et al.

(10) Patent No.: US 10,038,105 B2
(45) Date of Patent: Jul. 31, 2018

(54) SEMICONDUCTOR DEVICES, A SEMICONDUCTOR DIODE AND A METHOD FOR FORMING A SEMICONDUCTOR DEVICE

(71) Applicant: Infineon Technologies AG, Neubiberg (DE)

(72) Inventors: Thomas Basler, Riemerling (DE); Joachim Mahler, Ragensburg (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 14 days.

(21) Appl. No.: 15/229,828

(22) Filed: Aug. 5, 2016

(65) Prior Publication Data
US 2017/0040431 A1    Feb. 9, 2017

(30) Foreign Application Priority Data

Aug. 6, 2015 (DE) .......................... 10 2015 112 919

(51) Int. Cl.
*H01L 29/861* (2006.01)
*H01L 29/08* (2006.01)
(Continued)

(52) U.S. Cl.
CPC ........ *H01L 29/861* (2013.01); *H01L 29/0619* (2013.01); *H01L 29/08* (2013.01);
(Continued)

(58) Field of Classification Search
CPC ............... H01L 29/861; H01L 29/0619; H01L 29/1608; H01L 29/08; H01L 29/872; H01L 29/47; H01L 29/36
See application file for complete search history.

(56) References Cited

U.S. PATENT DOCUMENTS 3,008,083 A * 11/1961 Maaz ..................... G01R 21/08
                                                                  323/294
4,035,757 A *  7/1977 Einthoven ........... H01L 29/8605
                                                                  257/467
(Continued)

FOREIGN PATENT DOCUMENTS

DE    102014115314 A1    4/2016
DE    102014116759 A1    5/2016
(Continued)

OTHER PUBLICATIONS

Baburske, Roman et al., "A new Diode Structure with Inverse Injection Dependency of Emitter Efficiency (IDEE)", Proceedings of The 22nd International Symposium on Power Semiconductor Devices & ICs, Hiroshima, pp. 165-168.
(Continued)

*Primary Examiner* — Earl Taylor
(74) *Attorney, Agent, or Firm* — Murphy, Bilak & Homiller, PLLC

(57) ABSTRACT

A semiconductor device includes at least one highly doped region of an electrical device arrangement formed in a semiconductor substrate and a contact structure including an NTC (negative temperature coefficient of resistance) portion arranged adjacent to the at least one highly doped region at a front side surface of the semiconductor substrate. The NTC portion includes a negative temperature coefficient of resistance material.

18 Claims, 16 Drawing Sheets

(51) Int. Cl.
  *H01L 29/36* (2006.01)
  *H01L 29/45* (2006.01)
  *H01L 29/47* (2006.01)
  *H01L 29/872* (2006.01)
  *H01L 29/06* (2006.01)
  *H01L 29/16* (2006.01)

(52) U.S. Cl.
  CPC .......... *H01L 29/1608* (2013.01); *H01L 29/36* (2013.01); *H01L 29/456* (2013.01); *H01L 29/47* (2013.01); *H01L 29/872* (2013.01)

(56) References Cited

U.S. PATENT DOCUMENTS

| | | | | |
|---|---|---|---|---|
| 6,373,079 | B1* | 4/2002 | Ruff | H01L 21/263 257/111 |
| 6,891,278 | B2* | 5/2005 | Muller | B01J 19/0093 257/706 |
| 7,554,173 | B2* | 6/2009 | Inaguchi | G01K 7/22 257/536 |
| 8,183,660 | B2* | 5/2012 | Rueb | H01L 29/08 257/478 |
| 8,440,553 | B2* | 5/2013 | Schmidt | H01L 21/3221 257/139 |
| 9,123,611 | B1* | 9/2015 | McKisson | G01J 1/00 |
| 9,252,292 | B2* | 2/2016 | Schulze | H01L 21/22 |
| 9,515,243 | B2* | 12/2016 | Kegler | H01L 35/04 |
| 9,576,944 | B2* | 2/2017 | Laven | H01L 27/0255 |
| 9,583,240 | B2* | 2/2017 | Flachowsky | H01C 1/16 |
| 9,627,502 | B2* | 4/2017 | Wilhelm | H01L 29/66181 |
| 2006/0267104 | A1* | 11/2006 | Scholz | H01L 29/7408 257/379 |
| 2008/0006897 | A1* | 1/2008 | Inaguchi | G01K 7/22 257/467 |
| 2008/0203517 | A1* | 8/2008 | Rueb | H01L 29/08 257/475 |
| 2009/0109582 | A1* | 4/2009 | Jack | H01H 85/046 361/56 |
| 2009/0293500 | A1* | 12/2009 | Chen | F25B 21/02 62/3.7 |
| 2010/0039477 | A1* | 2/2010 | Kuk | B41J 2/14072 347/62 |
| 2012/0001679 | A1* | 1/2012 | Privitera | H01C 7/006 327/524 |
| 2013/0049159 | A1* | 2/2013 | Schmidt | H01L 28/22 257/467 |
| 2014/0009221 | A1* | 1/2014 | Motz | G01R 33/0029 327/564 |
| 2014/0205336 | A1* | 7/2014 | Chu | H01C 7/021 399/333 |
| 2014/0264343 | A1* | 9/2014 | Harrington, III | H01L 29/7803 257/51 |
| 2015/0016487 | A1* | 1/2015 | Britton | G01K 1/20 374/185 |
| 2015/0076650 | A1* | 3/2015 | Schulze | H01L 21/22 257/467 |
| 2015/0099341 | A1* | 4/2015 | Gruber | H01L 28/20 438/382 |
| 2015/0364468 | A1* | 12/2015 | Kiep | H01L 29/7395 257/139 |
| 2016/0111415 | A1* | 4/2016 | Basler | H01L 29/7397 257/140 |
| 2016/0133620 | A1* | 5/2016 | Pedone | H01L 27/0259 257/140 |
| 2016/0155796 | A1* | 6/2016 | Basler | H01L 29/861 257/139 |
| 2016/0163689 | A1* | 6/2016 | Laven | H01L 27/0255 257/334 |
| 2016/0181496 | A1* | 6/2016 | Kegler | H01L 35/04 257/53 |
| 2017/0040431 | A1* | 2/2017 | Basler | H01L 29/36 |
| 2017/0122898 | A1* | 5/2017 | Akasaka | G01N 27/4073 |

FOREIGN PATENT DOCUMENTS

| | | |
|---|---|---|
| JP | 2005039948 A | 2/2005 |
| JP | 2006225708 A | 8/2006 |

OTHER PUBLICATIONS

Baliga, B. Jayant, "New Rectifier Concepts", Modern Power Devices, Wiley, 1987, pp. 440-443.

Chu, Kunmo et al., "Smart conducting polymer composites having zero temperature coefficent of resistance", Nanoscale, Royal Society of Chemistry, 2015, pp. 471-478.

Matsudai, et al., "Advanced Cathode and Anode Injection Control Concept for 1200V SC(Schottky Controlled Injection)—Diode", Proceedings of the 26th International Symposium on Power Semiconductor Devices & IC's, Waikoloa, Hawaii, Jun. 2014, pp. 19-22.

Schlangenotto, Heinrich et al., "Improved Recovery of Fast Power Diodes with Self-Adjusting p Emitter Efficiency", IEEE Electron Device Letters, vol. 10, No. 7, Jul. 1989, pp. 322-324.

* cited by examiner

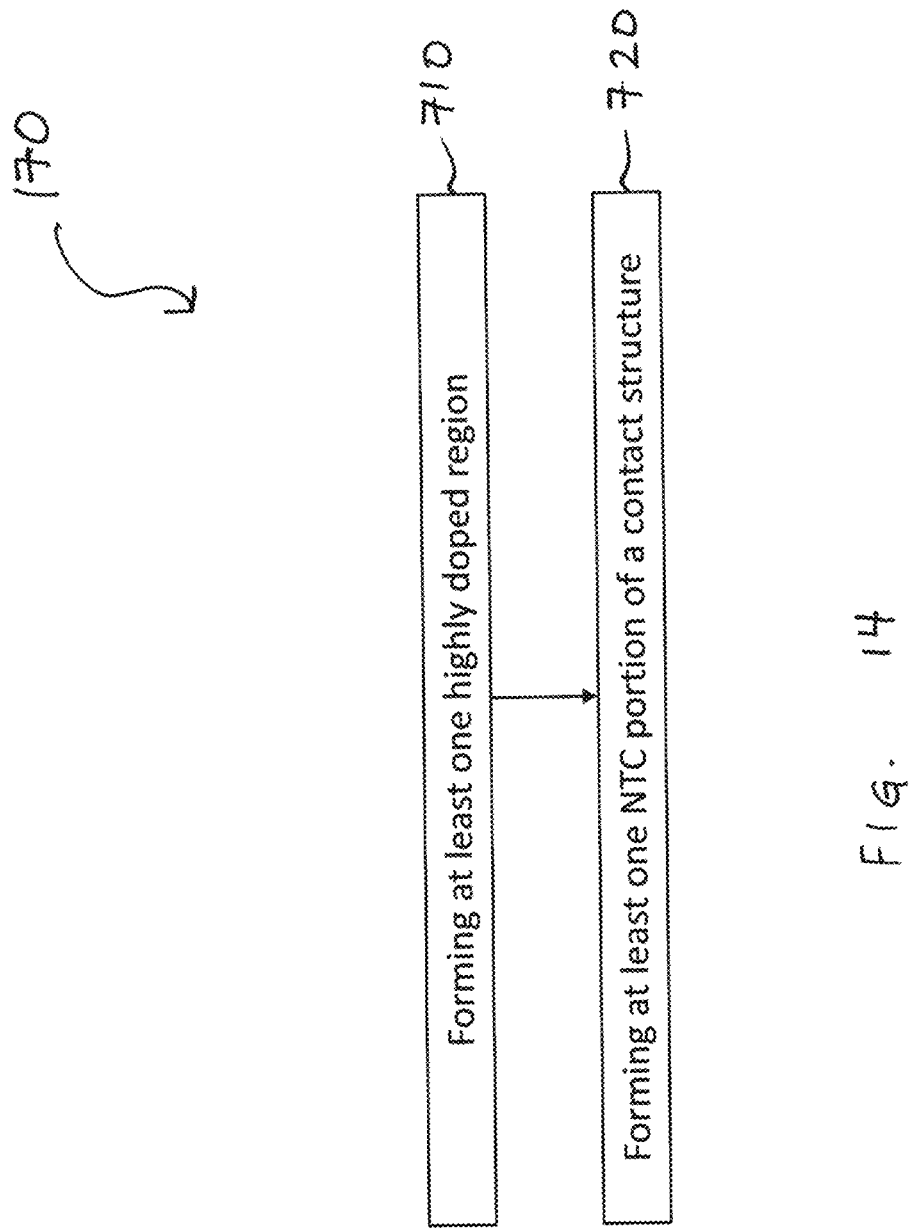

US 10,038,105 B2

SEMICONDUCTOR DEVICES, A SEMICONDUCTOR DIODE AND A METHOD FOR FORMING A SEMICONDUCTOR DEVICE

TECHNICAL FIELD

Embodiments relate to concepts for semiconductor device structures, and in particular to semiconductor devices, a semiconductor diode, and a method for forming a semiconductor device.

BACKGROUND

Excess currents (or surge currents or over currents) in power semiconductor components or devices may be triggered by failures in supply networks (e.g. on the entry side of a converter or a phase short circuit), or in special conditions of an inverter load. Power semiconductor components may be loaded with momentary or short term excess currents during operation, and may suffer from damages. It is desired to reduce damages caused by surge currents and improve the reliability of power semiconductor components when surge currents occur, for example.

SUMMARY

It is a demand to provide concepts for semiconductor devices with improved reverse recovery behavior, low switching currents and/or improved handling of surge currents.

Some embodiments relate to a semiconductor device comprising at least one highly doped region of an electrical device arrangement formed in a semiconductor substrate. The semiconductor device further comprises a contact structure comprising an NTC (negative temperature coefficient of resistance) portion arranged adjacent to the at least one highly doped region at a front side surface of the semiconductor substrate, wherein the NTC portion comprises a negative temperature coefficient of resistance material.

Some embodiments relate to a semiconductor diode comprising a first cathode/anode region arranged at a first surface of a semiconductor substrate. The first cathode/anode region comprises a highly doped region. The semiconductor diode further comprises a second cathode/anode region arranged at a second surface of the semiconductor substrate. The semiconductor diode further comprises a contact structure comprising a NTC portion arranged adjacent to the at least one highly doped region of the first cathode/anode region at the first surface of the semiconductor substrate, wherein the NTC portion comprises a negative temperature coefficient of resistance material.

Some embodiments relate to a semiconductor device comprising a device doping region of an electrical device arrangement formed in a semiconductor substrate. The device doping region comprises a highly doped region and a lower doped region of the same conductivity type, wherein the lower doped region laterally surrounds the highly doped region. The semiconductor device further comprises a contact structure comprising a NTC portion arranged adjacent to the highly doped region at the surface of the semiconductor substrate, wherein the NTC portion comprises a negative temperature coefficient of resistance material.

Some embodiments relate to a method for forming a semiconductor device. The method comprises forming at least one highly doped region of an electrical device arrangement in a semiconductor substrate. The method further comprises forming at least one NTC portion of a contact structure adjacent to the highly doped region of the electrical device arrangement at a front side surface of the semiconductor substrate. The at least one NTC portion comprises a negative temperature coefficient of resistance material.

Those skilled in the art will recognize additional features and advantages upon reading the following detailed description, and upon viewing the accompanying drawings.

BRIEF DESCRIPTION OF THE FIGURES

Some embodiments of apparatuses and/or methods will be described in the following by way of example only, and with reference to the accompanying figures, in which

FIG. 14 shows a flow chart of a method for forming a semiconductor device.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent." etc.).

The terminology used herein is for the purpose of describing particular embodiments only and is not intended to be limiting of example embodiments. As used herein, the singular forms "a." "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1:
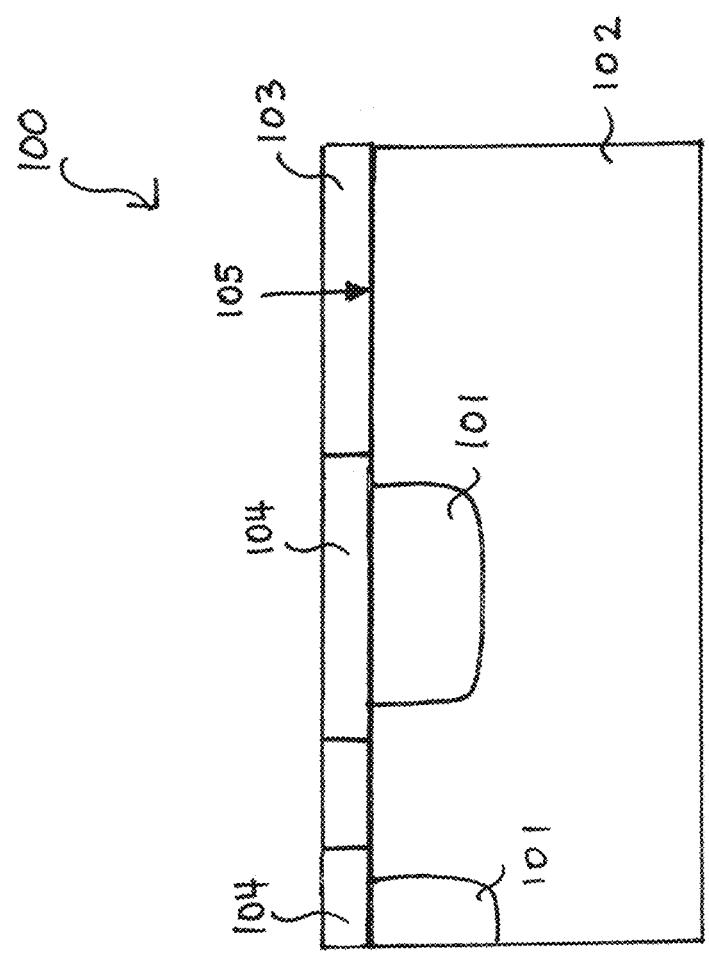
FIG. 1 shows a schematic illustration of a semiconductor device comprising an NTC material.

FIG. 1 shows a schematic illustration of a semiconductor device 100 according to an embodiment.

The semiconductor device 100 comprises at least one highly doped region 101 of an electrical device arrangement formed in a semiconductor substrate 102.

The semiconductor device 100) further comprises a contact structure 103 comprising an NTC portion 104 arranged adjacent to the at least one highly doped region 101 at a front side surface 105 of the semiconductor substrate 102. The NTC portion 104 comprises a negative temperature coefficient of resistance material Due to the arrangement of the NTC (negative temperature coefficient of resistance) portion 104 comprising negative temperature coefficient of resistance (NTC) material at the front side surface 105 of the semiconductor substrate, the surge current capability of the semiconductor device 100 may be improved, for example. For example, the current flow in the at least one highly doped region 101 may be increased due to the NTC material of the NTC portion 104 becoming highly conductive at a critical temperature. For example, a forward voltage drop of the semiconductor device 100 for a given current (or power) may be reduced leading to increased surge-current capability in the semiconductor device 100.

The at least one highly doped region 101 may have a doping of a first conductivity type. A region comprising the first conductivity type may be a p-doped region (e.g. caused by incorporating aluminum ions or boron ions) or an n-doped region (e.g. caused by incorporating nitrogen ions, phosphor ions or arsenic ions). Consequently, a region having a doping of the second conductivity type indicates an opposite n-doped region or p-doped region. For example, the first conductivity type may indicate an n-doping and the second conductivity type may indicate a p-doping or vice-versa.

The at least one highly doped region 101 may have an average doping concentration of more than $1 \times 10^{18}$ dopant atoms per cm$^3$ (or e.g. between $1 \times 10^{18}$ dopant atoms per cm$^3$ and $1 \times 10^9$ dopant atoms per cm$^3$). The average doping concentration may be a measured number of dopant atoms per volume averaged over a region of interest of the at least one highly doped region 101, for example.

The at least one highly doped region 101 may include one or a plurality of highly doped regions 101, for example. The at least one highly doped region 101 (e.g. the plurality of highly doped regions 101) may be arranged directly at the front side surface 105 of the semiconductor substrate 102. For example, the highly doped regions 101 may be arranged laterally along the front side surface 105 of the semiconductor substrate 102.

Each highly doped region 101 may have a maximum lateral dimension of between 20 µm and 100 µm (or e.g. between 40 µm and 75 µm), for example. The maximum lateral dimension may be the largest dimension or size of the highly doped region 101 measured in a direction substantially parallel to the front side surface 105 of the semiconductor substrate 102, for example. Each highly doped region 101 may have a maximum vertical dimension of between 1 µm and 10 µm or between 3 and 8 µm, for example. The maximum vertical dimension may be the largest dimension or size of the highly doped region 101 measured in a direction substantially perpendicular to the front side surface 105 of the semiconductor substrate 102, for example.

A highly doped region 101 (of the at least one highly doped region 101) may be laterally separated in the semiconductor substrate 102 from a neighboring highly doped region 101 by a lateral spacing. A maximum lateral spacing between neighboring highly doped regions 101 may be between 5 µm and 100 µm (or e.g. between 10 µm and 80 µm, or e.g. between 30 µm and 70 µm), for example. The maximum lateral spacing may be the largest distance measured between neighboring highly doped regions 101 in a direction substantially parallel to the front side surface 105 of the semiconductor substrate 102, for example. Portions of (other) device doping regions (having the same or different conductivity type as the at least one highly doped region 101) may be formed between the neighboring highly doped regions 101 in the lateral spacings, for example.

The contact structure 103 may be an electrically conductive electrode structure (e.g. an anode or a cathode structure) for delivering a voltage (e.g. a biasing voltage) to the one or more device doping regions at the front side surface 105 of the semiconductor substrate 102, for example. The contact structure 103 may be formed on (e.g. directly on) the front side surface 105 of the semiconductor substrate 102, for example. The contact structure 103 may be formed directly adjacent to one or more device doping regions at the front side surface 105 of the semiconductor substrate 102, for example.

The NTC portion 104 of the contact structure 103 comprises a negative temperature coefficient (NTC) material. The NTC material may have a negative temperature coefficient of resistance, for example. For example, the NTC material may have a variable electrical resistivity which may decrease with increasing temperature. For example, the electrical resistivity of the negative temperature coefficient material of the NTC portion undergoes a maximum change in electrical resistivity at a temperature interval between 170° C. and 250° C. (or e.g. between 180° C. and 220° C.). For example, the electrical resistivity of the negative temperature coefficient material of the NTC portion changes by at least 50% (or e.g. at least 80%, or e.g. at least 95%) of its electrical resistivity value at 150° C. at a temperature interval between 170° C. and 250° C. For example, an electrical resistivity of the negative temperature coefficient material of the NTC portion may reduce to (or change to) between 0.0005% (e.g. for phase change materials) and 50% (or e.g. to less than 20%, or e.g. to less than 5%) of its electrical resistivity value at 150° C. at a temperature interval between 170° C. and 250° C. The temperature interval may be between 1° C. and 80° C., or (e.g. between 1° C. and 30° C., or e.g. between 2° C. and 20° C., or e.g. between 1° C. and 10° C.). For example, the temperature interval may be 1° C. or e.g. 2° C., or e.g. 10° C., or e.g. 20° C., or e.g. 30° C. For example, the change in the electrical resistivity of the negative temperature coefficient material of the NTC portion may be a gradual change over (or within) the temperature interval between 170° C. and 250° C.

The NTC material of the NTC portion 104 may have a temperature coefficient of resistance which is more negative than a temperature coefficient of silicon (or a temperature coefficient of the semiconductor substrate 102) at a temperature interval between 170° C. and 250° C. For example, the NTC material of the NTC portion 104 may have a temperature coefficient of resistance which is more negative than a temperature coefficient of the highly doped region 101 at a temperature interval between 170° C. and 250° C.

The NTC material of the NTC portion 104 may include at least one material from the following group of materials. The group of materials may consist of: a chalcogenide material, a phase change material, a Schottky metal and a composite material comprising polymer and metal, for example. For example, the NTC material of the NTC portion 104 may include a chalcogenide material including germanium (Ge), or antimony (Sb) or Tellurium (Te). For example, the NTC material of the NTC portion 104 may include a mixture of Ge, Sb and Te (GST) (which may be used in optical memory media or phase change memory applications). The electrical resistance of these materials may be significantly reduced in phase transitions (e.g. at a temperature interval between 170° C. and 250° C.), for example.

Additionally, alternatively or optionally, the NTC material of the NTC portion 104 may be (or may include) a semiconductor material having a bandgap energy less than a bandgap energy of silicon (1.11 EV at 300K). For example, the NTC material of the NTC portion 104 may include or may be germanium (Ge) which may have a band gap of 0.66 eV at 300K. For example, the NTC material of the NTC portion 104 may include or may be germanium-telluride (GeTe) which may have a band gap of 0.6 eV at 300K.

Additionally, optionally or alternatively, the NTC material of the NTC portion 104 may include or may be a metal for forming a Schottky contact with the highly doped regions 101. Additionally, optionally or alternatively, the NTC portion 104 may include the NTC material and also a metallization structure including one or more metallization layers, for example.

Additionally, optionally or alternatively, the NTC material of the NTC portion 104 may include metal oxide which may be used as an NTC material. Optionally, the NTC material of the NTC portion 104 may include a mixture of metal oxides and germanium. For example, the NTC material of the NTC portion 104 may include magnesium oxide (MgO), titanium oxide (TiO), magnesium nickel oxide (Mg—NiO) or cobalt (Co), or mixtures of these materials. For example, the NTC material of the NTC portion 104 may include a mixture of MgO and TiO and optionally or additionally, Co. Alternatively, the NTC material of the NTC portion 104 may include Mg—NiO and optionally or additionally, Co.

Additionally, alternatively or optionally, the NTC material of the NTC portion 104 may be a composite material comprising polymer and metal (e.g. a metal-polymer composite material). For example, the NTC material of the NTC portion 104 may include metallic-based particles coated with encapsulation (e.g. electrically insulating or isolation) material layers.

The encapsulation material may include or may be a polymer for encapsulation (e.g. encapsulating or coating the metal spheres), for example. For example, the polymer (encapsulation) material may include polycarbonate, polyamide (e.g. polyimide 11) or Poylvinylacetate (e.g. highly polymerized Poylvinylacetate) or a combination of these materials. These polymer (encapsulation) material may have a melting temperature in the range of about 200° C. (at a temperature range reached when surge currents occur), for example. At this range of temperatures, the polymer (encapsulation) material may melt, which may lead to a selective pressure contact between the (previously) encapsulated metal particles. This may leads to the resistance in this region falling by orders of magnitude. With cooling below the polymer melting temperature, the polymer may solidify, causing the number of pressure contacts between the metal particles to be clearly reduced and the resistance returning or climbing to its original magnitude. Optionally, if an irreversible formation is preferred, polymers which decompose at temperatures higher than 220° C. (e.g. Polyoxymethylene POM) may be used, for example.

The particles of the composite NTC material may comprise metal. For example, the metal particles may be spheres or may be of another suitable shape. For example, the particles may be silver (Ag) spheres or may include silver. Additionally, alternatively or optionally, the spheres (or particles) may include elasto-plastic deformable Ag, for example. The (metal) spheres or particles may have a maximum dimension (e.g. a largest dimension in one direction or diameter) of a few micrometers (e.g. between 1 μm and 10 μm), for example. The particle size (e.g. a lateral dimension or diameter of the spheres) may be dependent (or vary with) the application temperature, so that at the critical temperature, the surface contact (e.g. the pressure contact between the particles and the encapsulation material) may increase sharply and the electrical resistance in this temperature range may fall by several orders of magnitude. For example, the particles (e.g. the metal spheres) may have a positive coefficient of thermal expansion (CTE), so that the higher the temperature the larger the relative expansion and the higher the pressure contact in comparison to the basic substrate.

Additionally, alternatively or optionally, the NTC material of the NTC portion 104 may include metallic-based particles coated with encapsulation (e.g. with a polymer-based coating) material layers and metallic-based particles without encapsulation (e.g. without the polymer-based coating). For example, the mixture of isolations material coated metal particles and the uncoated metal particles as a composite NTC material may register a significant and defined resistance drop in a defined temperature region or interval (e.g. between 170° C. and 250° C.) based on the proportion of the individual components of the mixture, the particle size and the polymer material selected, for example.

The NTC portion 104 of the contact structure 103 may have a maximal thickness which lies between 0.5 μm and 10 μm (or e.g. between 1 μm and 5 μm, or e.g. between 3 μm and 5 μm), for example. The maximal thickness may be a largest thickness of the NTC portion 104 of the contact structure measured in a direction substantially perpendicular to the front side surface 105 of the semiconductor substrate, for example.

The contact structure 103 may further include a Schottky or ohmic contact portion (or e.g. a positive temperature coefficient (PTC) material contact portion) arranged laterally adjacent to the NTC portion of the contact structure. For example, the contact structure 103 may include a Schottky contact portion including a Schottky contact material for forming a Schottky barrier contact with a device doping region at the front side surface 105 of the semiconductor substrate 102. Alternatively or optionally, the contact structure 103 may include an ohmic contact portion including an ohmic material for forming an ohmic contact with a device doping region at the front side surface 105 of the semiconductor substrate 102, for example. The Schottky or ohmic contact portion may be formed on a portion of a device doping region laterally adjacent to the highly doped region 101 or between neighboring highly doped regions 101, for example. For example, the portions of device doping regions on which the Schottky or ohmic contact portion is formed may have the same or different conductivity type as the at least one highly doped region 101.

The Schottky or ohmic contact portion may include or may be a metal. For example, the Schottky or ohmic contact portion may include a positive temperature coefficient (PTC) of resistance material.

The front side surface 105 of the semiconductor substrate 102 may be a surface of the semiconductor substrate 102 towards metal layers, insulation layers and/or passivation layers on top of the main surface of the semiconductor substrate 102 or on a surface of one of these layers. For example, the front side surface 105 of the semiconductor substrate 102 may be a lateral surface of the semiconductor substrate 102 at which more (or a majority of) active elements of the semiconductor device structures are formed. For example, more complex structures may be located at the front side surface 105 of the semiconductor substrate 102 than at an opposite facing back side surface of the semiconductor substrate 102.

The back side surface of the semiconductor substrate 102 may be a surface at which a back side metallization structure is arranged. The back side metallization structure may be a single continuous metallization structure arranged on (e.g. directly on) the back side surface, for example. The back side metallization structure may cover the whole of the back side surface of the semiconductor substrate or more than 80% of the back side surface of the semiconductor substrate, for example.

For power transistor structures, the front side surface 105 of the semiconductor substrate 102 may be a lateral side or surface of the semiconductor substrate 102 at which a first source/drain region and a gate region of a MOSFET may be formed, or at which a collector region and a gate region of an IGBT may be formed, for example. The back side surface of the semiconductor substrate 102 may be a surface at which a second source/drain region of a MOSFET may be formed, or at which an emitter region of an IGBT may be formed, for example.

For power diodes, the front side surface 105 of the semiconductor substrate 102 may be a lateral side or surface of the semiconductor substrate 102 closer to a p-n junction than the back side surface of the semiconductor substrate 102, for example. For example, the front side surface 105 of the semiconductor substrate 102 may be a lateral side or surface of the semiconductor substrate 102 at which a highly doped device doping region having a conductivity type opposite to a conductivity type of a lightly doped drift region of an electrical device arrangement is formed, for example. The back side surface of the semiconductor substrate 102 may be a lateral side or surface of the semiconductor substrate 102 at which a highly doped device doping region having same conductivity type as a lightly doped drift region of an electrical device arrangement is formed, for example.

A (front or back) side surface of the semiconductor substrate 102 may be a substantially even plane (e.g. neglecting unevenness of the semiconductor substrate 102 due to the manufacturing process and trenches). In comparison to a basically vertical edge of the semiconductor substrate 102, the front side surface 105 and back side surface may each be a basically horizontal surface extending laterally. For example, a lateral dimension (e.g. a diameter or a length) of the (front or back) side surface of the semiconductor substrate 102 may be more than 100 times larger (or more than 1000 (times or more than 10000 times) than a distance between the front side surface 105 of the semiconductor substrate 102 and the opposite back side surface of the semiconductor substrate. For example, a lateral dimension (e.g. a diameter) of the main surface of the semiconductor substrate 102 may be more than 100 times larger (or more than 1000 times or more than 10000 times) than a maximal height of structures on the main (or front) surface.

The semiconductor substrate 102 may have a maximal thickness of between 10 μm and 1000 or between 40 and 700 μm (or e.g. between 50 μm and 350 μm or e.g. between 50 μm and 150 μm), for example. The maximal thickness of the semiconductor substrate 102 may be a largest height of the semiconductor substrate measured in a direction between the front side surface and back side surface of the semiconductor substrate.

The semiconductor substrate 102 may include a semiconductor substrate material (e.g. a semiconductor substrate wafer), for example. For example, the semiconductor substrate material may be a silicon-based semiconductor substrate material, a silicon carbide-based semiconductor substrate material, a gallium arsenide-based semiconductor substrate material or a gallium nitride-based semiconductor substrate material.

The semiconductor device 10) may be a power semiconductor device. In other words, a semiconductor device according to the described concept or one or more embodiments described above or below may have a blocking voltage of more than 100 V (e.g. between 100 V and 10000 V or more than 200 V, more than 500 V or more than 1000 V), for example.

The electrical device arrangement of the semiconductor device 100 may be a vertical electrical device arrangement. For example, the electrical device arrangement of the semiconductor device 100 may be a (vertical) merged pin Schottky (MPS) diode arrangement, (vertical) a self-adjusting p-emitter efficiency diode (SPEED) arrangement, a (vertical) inverse injection dependency of emitter efficiency diode (IDEE) arrangement, a (vertical) thyristor, a (vertical) metal oxide semiconductor field effect transistor (MOSFET) arrangement, or a (vertical) insulated gate bipolar transistor (IGBT) arrangement, for example. A vertical electrical device arrangement may be an electrical device arrangement when a bulk or drift current flows from a front side surface 105 of the semiconductor substrate 102 to a back side surface of the semiconductor substrate 102 or vice versa.

The at least one highly doped region 101 of the electrical device arrangement may be (or may form) at least part of a first device doping region of the electrical device arrangement formed in the semiconductor substrate 102. The first device doping region may have a first conductivity type and may include one or more doped regions of the same (first) conductivity type, for example. For example, the first device doping region may be a (first) cathode/anode region of a diode arrangement (e.g. of a MPS diode arrangement, a SPEED diode arrangement or an IDEE arrangement), for example. Alternatively, the first device doping region may be a (first) source/drain region of a MOSFET arrangement or an emitter region of an IGBT arrangement, for example.

In some electrical device arrangements (e.g. in a MPS diode arrangement or an IDEE diode arrangement), the first device doping region may include the at least one highly doped region (or e.g. the first device doping region may have no other doping regions besides the highly doped regions), for example.

Additionally, alternatively or optionally, in some electrical device arrangements (e.g. in a SPEED diode arrangement), the first device doping region of the electrical device arrangement may further include a lower doped region laterally surrounding the at least one highly doped region 101 (of the first device doping region) at the front side surface 105 of the semiconductor substrate 102. For example, the lower doped region may be formed adjacent or directly adjacent to the highly doped regions 101 in a direction substantially parallel to the front side surface 105 of the semiconductor substrate 102, for example. At least part of the lower doped region of the first device doping region may be arranged at the front side surface 105 of the semiconductor substrate 102. For example, the lower doped region of the first device doping region may be located or arranged laterally adjacent to the highly doped regions 101 of the first device doping region at the front side surface 105 of the semiconductor substrate 102. Additionally or optionally, portions of the lower doped region of the first device doping regions may be arranged between the neighboring highly doped regions 101, for example.

The lower doped region of the first device doping region may have a maximum vertical dimension of between 2 µm and 20 µm (or e.g. between 5 µm and 10 µm), for example. The maximum vertical dimension may be the largest dimension or size of the lower doped region measured in a direction substantially perpendicular to the front side surface 105 of the semiconductor substrate 102, for example. The maximum vertical dimension of the lower doped region may be larger (e.g. at least 30% or at least two times larger) than the maximum vertical dimension of the highly doped region 101, for example.

The at least one highly doped region 101 and the lower doped region of the first device doping region may have the same (e.g. the first) conductivity type, for example. The at least one highly doped region 101 of the first device doping region may have a doping concentration of more than 10 times or even more than 100 times larger than the lower doped region of the first device doping region. For example, the lower doped region of the first device doping region may have an average doping concentration of less than $1\times10^{17}$ dopant atoms per $cm^3$ (or e.g. between $1\times10^{15}$ dopant atoms per $cm^3$ and $1\times10^{17}$ dopant atoms per $cm^3$, or e.g. about $1\times10^{15}$ dopant atoms per $cm^3$). The average doping concentration may be a measured number of dopant atoms per volume averaged over a region of interest of the at least one lower doped region, for example.

The electrical device arrangement may further include a second device doping region. The second device doping region may be a (second) cathode/anode region of a diode arrangement (e.g. a MPS diode arrangement, a SPEED diode arrangement or an IDEE arrangement), for example. For diode arrangements, the second device doping region may have a second conductivity type.

At least part of the second device doping region may be arranged adjacent between the first device doping region and a back side surface of the semiconductor substrate 102, for example. For example, at least part of the second device doping region may be arranged adjacent to a back side surface of the semiconductor substrate 102. The second device doping region may include at least one (first) highly doped region having the second conductivity type arranged at the back side surface of the semiconductor substrate 102. The at least one (first) highly doped region of the second device doping region may have an average doping concentration of more than $1\times10^{18}$ dopant atoms per $cm^3$ (or e.g. between $1\times10^{18}$ dopant atoms per $cm^3$ and $4\times10^{20}$ dopant atoms per $cm^3$). The average doping concentration may be a measured number of dopant atoms per volume averaged over a region of interest of the at least one (first) highly doped region of the second device doping region, for example.

The second device doping region may further include a lower doped portion having the same conductivity type as the (first) highly doped region (e.g. the second conductivity type) laterally surrounding the at least one (first) highly doped region of the second device doping region at the back side surface of the semiconductor substrate 102, for example. For example, the lower doped region of the second device doping region may be formed adjacent or directly adjacent to the at least one (first) highly doped region of the second device doping region in a direction substantially parallel to the front side surface 105 or back side surface of the semiconductor substrate 102, for example. For example, the lower doped region of the second device doping region may be formed laterally adjacent to the at least one (first) highly doped region of the second device doping region.

The lower doped region of the second device doping region may have an average doping concentration of less than $1\times10^{1'}$ dopant atoms per $cm^3$ (or e.g. between $1\times10^{16}$ dopant atoms per $cm^3$ and $1\times10^{17}$ dopant atoms per $cm^3$). The average doping concentration may be a measured number of dopant atoms per volume averaged over a region of interest of the lower doped region of the second device doping region, for example.

The second device doping region may further include at least one (second) highly doped region (e.g. a plurality of second highly doped regions) located at the front side (or back side) surface of the semiconductor substrate. Each (second) highly doped region of the second device doping region may be located laterally adjacent to the highly doped region 101 of the first device doping region or between neighboring highly doped regions 101 of the first device doping region, for example.

The at least one (second) highly doped region of the second device doping region may have an average doping concentration of more than $1\times10^{18}$ dopant atoms per $cm^3$ (or e.g. between $1\times10^{18}$ dopant atoms per $cm^3$ and $4\times10^{20}$ dopant atoms per $cm^3$). The average doping concentration may be a measured number of dopant atoms per volume averaged over a region of interest of the at least one (second) highly doped region of the second device doping region, for example.

The semiconductor device 100 may further include a back side contact structure comprising an NTC portion arranged adjacent to the at least one (first) highly doped region of the second device doping region The NTC portion comprises a NTC material. The features described in connection with the NTC material of the NTC portion 104 of the contact structure 103 may be similar to the NTC material of the NTC portion of the back side contact structure, for example. The back side contact structure may further include a Schottky or ohmic contact portion arranged laterally adjacent to the NTC portion of the back side contact structure. For example, the back side contact structure may include a Schottky contact portion including a Schottky contact material for forming a Schottky barrier contact with a device doping region at the back side surface of the semiconductor substrate 102. Alternatively or optionally, the back side contact structure may include an ohmic contact portion including an ohmic material for forming an ohmic contact with a device doping region at the back side surface of the semiconductor substrate 102, for example. The Schottky or ohmic contact portion may be formed on a portion of a device doping region laterally adjacent to at least one (first) highly doped region of the second device doping region or between neighboring (first) highly doped regions of the second device doping region, for example. For example, the portions of device doping regions on which the Schottky or ohmic contact portion is formed may have the same or different conductivity type as the at least one (first) highly doped region of the second device doping region.

Alternatively or optionally, the second device doping region may be a (second) source/drain region of a MOSFET arrangement or a collector region of an IGBT arrangement, for example. For MOSFET or IGBT arrangements, the second device doping region may have the first conductivity type or second conductivity type, for example.

The second device doping region (e.g. a collector region) may include one or more highly doped regions arranged laterally at the back side surface of the semiconductor substrate 102, for example. The second device doping region may further include one or more lower doped regions or portions having the same conductivity type as the highly doped regions of the second device doping region. The one or more lower doped regions or portions may laterally surround or may be arranged laterally adjacent to the one or more highly doped regions of the second device doping region, for example.

In power electronic applications, the power semiconductor may be loaded during operation with momentary or short term excess currents. Such excess or over currents may be triggered by failures in supply networks on the entry side of a converter (e.g. phase short circuits), or in special conditions of the inverter load. The maximal excess current which a component may handle may be limited in data sheets, and may be represented by a surge current $I_{FSM}$. This value may depend on the energy input of the excess current, from pulse duration, height of the peak current and voltage drop of the component. Thyristors and diodes may be optimized for a good excess current (e.g. surge current), in which the forward voltage step may be regulated at low values at high currents. To increase the surge current reliability of diodes, structured anodes may be applied in SPEED (self-adjusting-p-emitter-efficiency-diode) diode arrangements, MPS (merged-pin-Schottky) diode arrangements or IDEE diodes arrangements. For example, highly doped regions (e.g. p+ regions or n+ regions) may be applied at the anode side (or cathode side) and may be used or activated in the case of a surge current. The emitter efficiency may vary with the diode current, for example. In normal currents, the emitter efficiency may be small to ensure small losses in reverse recovery. The current is therefore not conducted (or guided) over the highly doped (p+ regions), for example.

The NTC material arranged at the back side surface (or front side surface) of the semiconductor substrate may introduce a temperature dependent resistance in the highly doped regions (e.g. the narrow highly doped p+ doped regions) of the diode structure (or SPEED structure) at the wafer back side (or front side). This may keep the switching losses low in normal operation and allow for a good hole injection in the regions in case of short circuiting. As soon as a critical Tj value is surpassed (e.g. $T_{j,max}$) at a surge current situation or short circuiting, the resistance of the NTC material may significantly drop, for example.

Increase in the surge current ability of the semiconductor device 100 may be achieved due to anode and/or cathode structuring. An NTC contact material may be arranged on the anode and the cathode, for example. The NTC contact material may be arranged in the region of the highly doped p+ or n+ anode and cathode regions, and may increase the surge current capability, for example. For example, the current flow through the (highly doped) regions may be increased if the NTC material becomes highly conductive at (or above) a critical temperature. The current flow in the highly doped region (e.g. the p+ doped or n+ doped) region increases and the forward voltage drop for a given current (or power) may be further reduced, for example.

The surge current ability of power semiconductor may be improved through the introduction of the NTC materials in the area of high current density, e.g. adjacent to regions with higher doping. These regions may have good electrical connection at high current densities and temperatures, and contribute to charge carrier injection, for example. At low temperatures and moderate current densities, only regions with low emitter efficiency are used, which leads to a good reverse recovery behavior and low switching losses, for example.

Additionally or optionally, in the edge region of the component, a small area may be provided with positive temperature coefficient of resistance (PTC) material to protect the edge region from high current densities at high temperatures.

Figure 2:
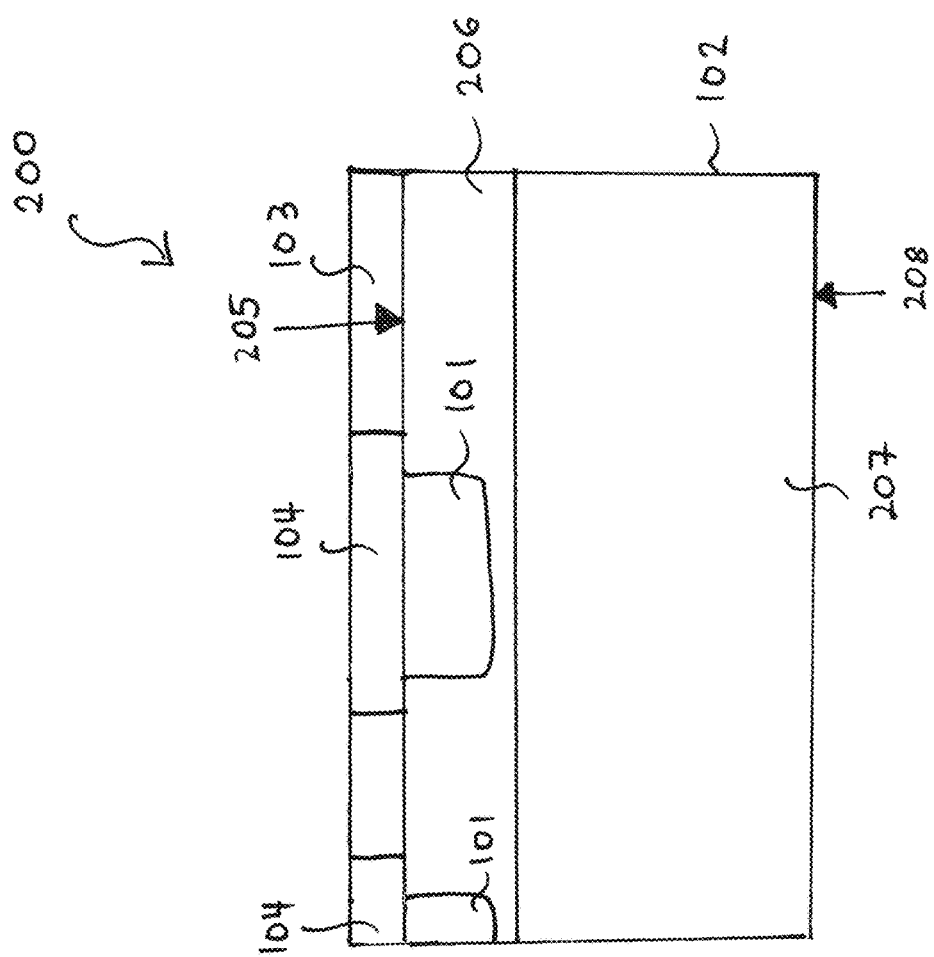
FIG. 2 shows a schematic illustration of a semiconductor diode comprising an NTC material.

FIG. 2 shows a schematic illustration of a semiconductor diode 200 according to an embodiment.

The semiconductor diode 200 comprises a first cathode/anode region 206 arranged at a first surface 205 of a semiconductor substrate 102. The first cathode/anode region 206 comprises a highly doped region 101.

The semiconductor diode 200 further comprises a second cathode/anode region 207 arranged at a second surface 208 of the semiconductor substrate 102.

The semiconductor diode 200 further comprises a contact structure 103 comprising a NTC portion 104 arranged adjacent to the at least one highly doped region 101 of the first cathode/anode region 206 at the first surface 205 of the semiconductor substrate 102. The NTC portion 104 comprises a negative temperature coefficient of resistance material.

Due to the arrangement of the NTC portion 104 comprising the NTC material arranged adjacent to the at least one highly doped region 101 of the first cathode/anode region 206, the surge current capability of the semiconductor diode 200 may be improved, for example. For example, the current flow in the at least one highly doped region 101 may be increased due to the NTC material of the NTC portion 104 becoming highly conductive at a critical temperature. For example, a forward voltage drop of the semiconductor diode 200 for a given current (or power) may be reduced leading to improved increased surge-current capability in the semiconductor diode 200, for example.

The semiconductor diode 200 may be similar to the semiconductor device 100 described in connection with FIG. 1, for example. For example, the semiconductor diode 200 may be a merged pin Schottky (MS) diode, a self-adjusting p-emitter efficiency diode (SPEED) or an inverse injection dependency of emitter efficiency diode (IDEE).

The first cathode/anode region 206 may be similar to the first device doping region of the semiconductor device described in connection with FIG. 1, for example. The second cathode/anode region 207 may be similar to the second device doping region of the semiconductor device described in connection with FIG. 1, for example. The first cathode/anode region 206 of the semiconductor diode 200 may be formed directly at the first surface 205 of the semiconductor substrate 102, for example. The second cathode/anode region 207 of the semiconductor diode 200 may be formed at the second surface 208 of the semiconductor substrate 102. The second cathode/anode region 207 of the semiconductor diode 200 may include a highly doped emitter region (e.g. an n+ region) located directly at the second surface 208 of the semiconductor substrate 102 and a base zone (or drift region), for example. The base zone of the second cathode/anode region 207 may be located between the first cathode/anode region 206 and the highly doped emitter region of the second cathode/anode region 207, for example.

Additionally or optionally, not more than one p-n junction may be located in the semiconductor substrate 102 between the first cathode/anode region 206 and the second cathode/anode region 207, for example.

The (first) surface 205 of the semiconductor substrate 102 may be a front side surface of the semiconductor substrate 102 and the (second) opposite facing surface 208 of the semiconductor substrate 102 may be a back side surface of the semiconductor substrate 102, for example. Alternatively, the (first) surface 205 of the semiconductor substrate 102 may be a back side surface of the semiconductor substrate 102 and the (second) opposite facing surface 208 of the semiconductor substrate 102 may be a front side surface of the semiconductor substrate 102, for example.

More details and aspects are mentioned in connection with the embodiments described above or below. The embodiments shown in FIG. 2 may comprise one or more optional additional features corresponding to one or more aspects mentioned in connection with the proposed concept or one or more embodiments described above (e.g. FIG. 1) or below (e.g. FIGS. 3 to 13).

Figure 3:
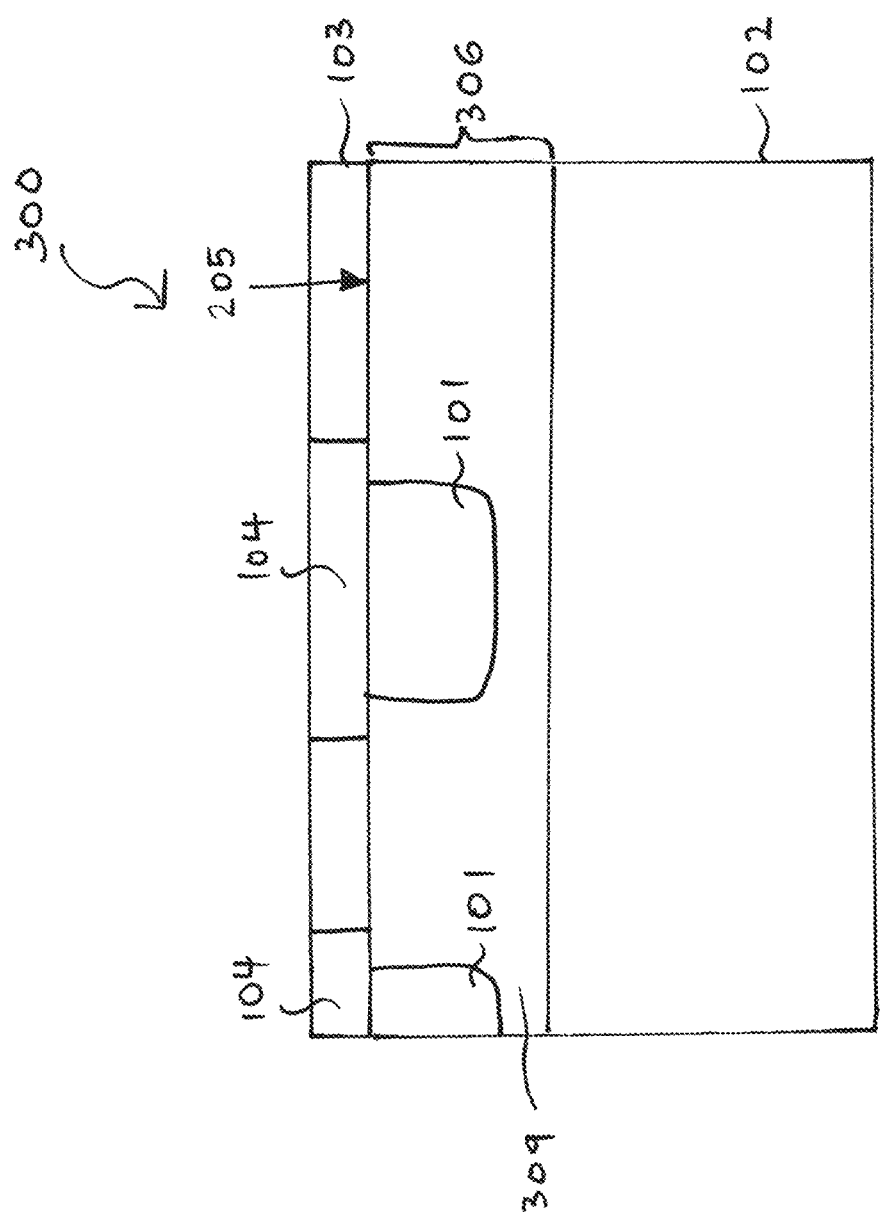
FIG. 3 shows a schematic illustration of a further semiconductor device comprising an NTC material.

FIG. 3 shows a schematic illustration of a semiconductor device 300 according to an embodiment.

The semiconductor device 300 comprises a device doping region 306 of an electrical device arrangement formed in a semiconductor substrate 102. The device doping region 306 comprises a highly doped region 101 and a lower doped region 309 of the same conductivity type. The lower doped region 309 laterally surrounds the highly doped region 101.

The semiconductor device 300 further comprises a contact structure 103 comprising a NTC portion 104 arranged adjacent to the highly doped region 101 at a surface 205 of the semiconductor substrate 102. The NTC portion 104 comprises a negative temperature coefficient of resistance material Due to the arrangement of the NTC portion 104 comprising the NTC material adjacent to the at least one highly doped region 101, the surge current capability of the semiconductor device 300 may be improved, for example. For example, the current flow in the at least one highly doped region 101 may be increased due to the NTC material of the NTC portion 104 becoming highly conductive at a critical temperature. For example, a forward voltage drop of the semiconductor device 300 for a given current (or power) may be reduced leading to improved increased surge-current capability in the semiconductor device 300, for example.

The semiconductor device 300 may be similar to the semiconductor device 100 described in connection with FIG. 1 and to the semiconductor diode 200 described in connection with FIG. 2, for example.

The lower doped region 309 of the device doping region 306 (e.g. a first device doping region) may be formed laterally adjacent to the highly doped region 101 of the device doping region 306. The lower doped region 309 of the device doping region 306 may be formed adjacent or directly adjacent to the highly doped region 101 in a direction substantially parallel to the (first) surface 205 of the semiconductor substrate 102, for example.

The (first) device doping region 306 may have the first conductivity type, for example. For example, the lower doped region 309 of the (first) device doping region 306 may have the same conductivity type as the highly doped region 101 of the (first) device doping region 306.

The lower doped region 309 of the (first) device doping region 306 may have an average doping concentration of less than $1 \times 10^{17}$ dopant atoms per $cm^3$ (or e.g. between $1 \times 10^{16}$ dopant atoms per $cm^3$ and $1 \times 10^{17}$ dopant atoms per $cm^3$).

The at least one highly doped region 101 of the (first) device doping region 306 may have an average doping concentration of more than $1 \times 10^{18}$ dopant atoms per $cm^3$ (or e.g. between $1 \times 10^{18}$ dopant atoms per $cm^3$ and $1 \times 10^{19}$ dopant atoms per $cm^3$).

The semiconductor device 300 may further include a second device doping region having a second conductivity type. At least part of the second device doping region may be arranged adjacent between the (first) device doping region 306 and a (second) opposite surface of the semiconductor substrate 102, for example.

The second device doping region may include at least one (first) highly doped region having the second conductivity type arranged at the (second) surface of the semiconductor substrate 102. The at least one (first) highly doped region of the second device doping region may have an average doping concentration of more than $1 \times 10^{18}$ dopant atoms per $cm^3$ (or e.g. between $1 \times 10^{18}$ dopant atoms per $cm^3$ and $4 \times 10^{20}$ dopant atoms per $cm^3$).

The second device doping region may further include a lower doped portion having the second conductivity type laterally surrounding the at least one (first) highly doped region of the second device doping region at the (second) surface of the semiconductor substrate 102, for example.

The lower doped region of the second device doping region may have an average doping concentration of less than $1 \times 10^{17}$ dopant atoms per $cm^3$ (or e.g. between $1 \times 10^{16}$ dopant atoms per $cm^3$ and $1 \times 10^{17}$ dopant atoms per $cm^3$).

The (first) surface 205 of the semiconductor substrate 102 may be a front side surface of the semiconductor substrate 102 and the (second) opposite facing surface of the semiconductor substrate 102 may be a back side surface of the semiconductor substrate 102, for example. Alternatively, the (first) surface 205 of the semiconductor substrate 102 may be a back side surface of the semiconductor substrate 102 and the (second) opposite facing surface of the semiconductor substrate 102 may be a front side surface of the semiconductor substrate 102, for example.

More details and aspects are mentioned in connection with the embodiments described above or below. The embodiments shown in FIG. 3 may comprise one or more optional additional features corresponding to one or more aspects mentioned in connection with the proposed concept or one or more embodiments described above (e.g. FIGS. 1 to 2) or below (e.g. FIGS. 4 to 14).

Figure 4:
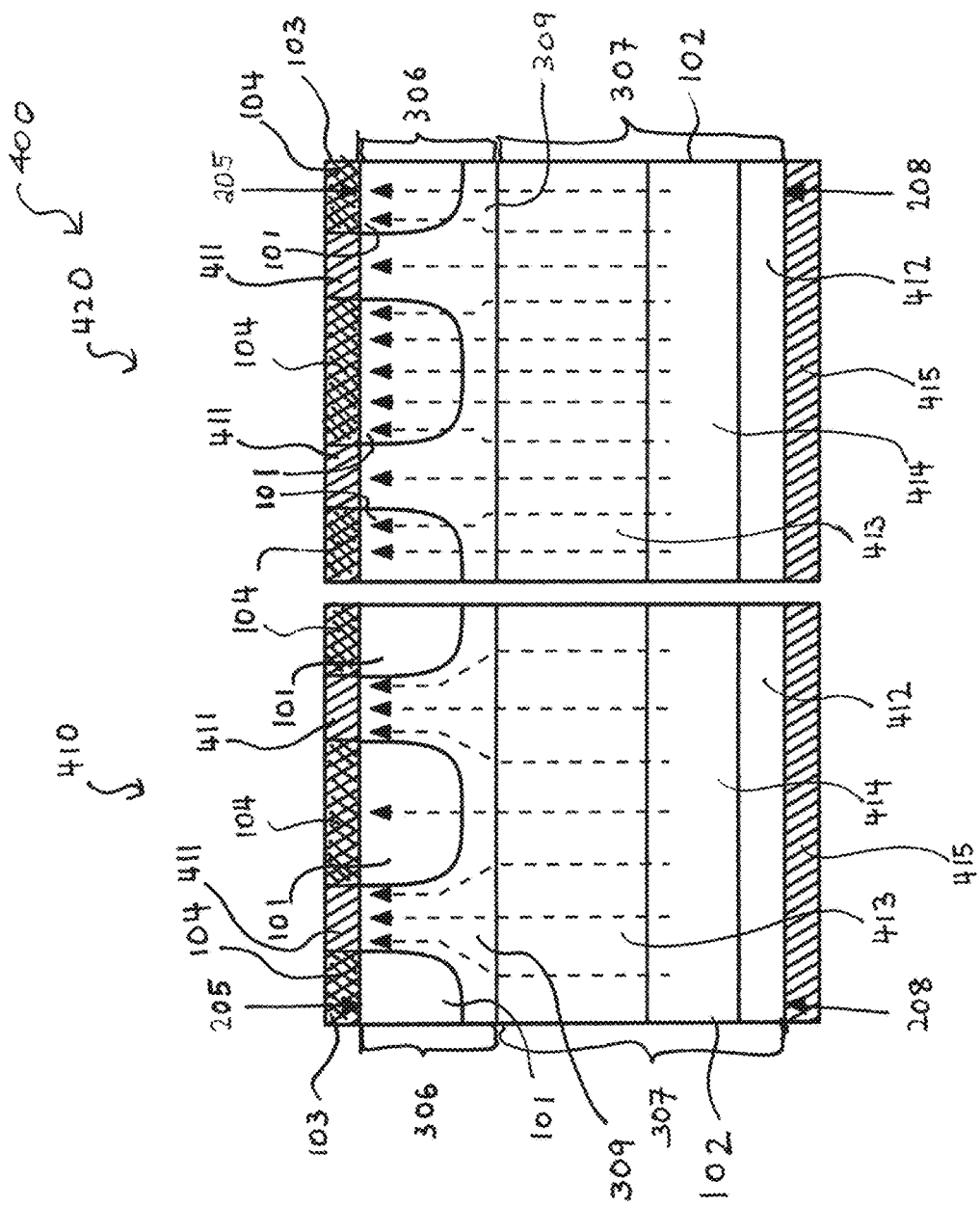
FIG. 4 shows a schematic illustration of a further semiconductor device comprising a diode arrangement and an NTC material.

FIG. 4 shows a schematic illustration of a semiconductor device 400 according to an embodiment. FIG. 4 shows the semiconductor device 400 operating in a low current density (j_low) operation mode 410 and in a high current density (j_high) operation mode 420.

The semiconductor device 400 may be similar to the semiconductor devices 100, 300 described in connection with FIGS. 1 and 3, and to the semiconductor diode 200 described in connection with FIG. 2, for example.

The semiconductor device 400 may include at least one highly doped region 101 having the first conductivity type of an electrical device arrangement formed in a semiconductor substrate 102. The semiconductor device 400 may include a first device doping region 306 having the first conductivity type (e.g. p type doped). The first device doping region 306 of the electrical device arrangement may include the at least one highly doped region 101 (e.g. one or a plurality of highly doped regions 101). The at least one highly doped region 101 (e.g. p+ type doped region) may be arranged directly at the first side surface 205 of the semiconductor substrate 102.

The at least one highly doped region 101 may have an average doping concentration of more than $1 \times 10^{18}$ dopant atoms per cm$^3$ (or e.g. between $1 \times 10^{18}$ dopant atoms per cm$^3$ and $1 \times 10^{19}$ dopant atoms per cm$^3$).

The first device doping region 306 of the electrical device arrangement may further include the lower doped region 309 having the first conductivity type (e.g. p type doped region). The lower doped region of the first device doping region may have an average doping concentration of less than $1 \times 10^{17}$ dopant atoms per cm$^3$ (or e.g. between $1 \times 10^{16}$ dopant atoms per cm$^3$ and $1 \times 10^{17}$ dopant atoms per cm$^3$).

The lower doped region 309 (e.g. p type doped region) may laterally surround the at least one highly doped region 101 of the first device doping region 306 at the first side surface 205 of the semiconductor substrate 102. For example, at least part of the lower doped region 309 may be arranged laterally adjacent to the at least one highly doped region 101 at the first side surface 205 of the semiconductor substrate 102. For example, portions of the lower doped region 309 may be formed laterally between neighboring highly doped regions 101. For example, at least part of the lower doped region of the first device doping region may be located or arranged at the first side surface 205 of the semiconductor substrate 102.

The electrical device arrangement may further include a second device doping region 307 having a second conductivity type (e.g. n-type doped). At least part of the second device doping region 307 may be arranged adjacent (e.g. directly adjacent) between the first device doping region 306 and a second side surface 208 of the semiconductor substrate 102, for example.

The semiconductor device 400 may further include the contact structure 103. The contact structure 103 may include or may have at least one NTC portion 104 (e.g. one or more NTC portions 104). Each NTC portion 104 may include a negative temperature coefficient of resistance material. Each NTC portion 104 of the contact structure 103 may be arranged adjacent to (or cover) a highly doped region 101 (or any further doping regions above the highly doped region 101) at the first side surface 205 of the semiconductor substrate 102.

The contact structure 103 may further include at least one Schottky or ohmic or PTC contact portion 411 (e.g. one or more Schottky or ohmic or PTC contact portions 411) arranged laterally adjacent to the NTC portions of the contact structure 103. For example, the Schottky contact portion 411 may include Schottky contact material for forming a Schottky barrier contact with the lower doped region 309 of the first device doping region 306 at the first side surface 205 of the semiconductor substrate 102. Alternatively, the ohmic contact portion 411 may include ohmic material for forming an ohmic contact with the lower doped region 309 of the first device doping region 306 at the first side surface 205 of the semiconductor substrate 102. Alternatively, the PTC contact portion 411 may include a PTC material. The Schottky or ohmic contact portions 411 may be arranged adjacent to the portions of the lower doped region 309 of the first device doping region 306 at the first side surface 205 of the semiconductor substrate, for example.

The semiconductor device 400 may include the second device doping region 307 having the second conductivity type (e.g. n type doped). The second device doping region 307 may include a highly doped region 412 (e.g. n+ doped region) having the second conductivity type arranged at the back side surface of the semiconductor substrate 102. The highly doped region 412 of the second device doping region 307 may have an average doping concentration of more than $1 \times 10^{18}$ dopant atoms per cm$^3$ (or e.g. between $1 \times 10^{18}$ dopant atoms per cm$^3$ and $4 \times 10^{20}$ dopant atoms per cm$^3$).

The second device doping region 307 may include a drift region 413 arranged adjacent (e.g. directly adjacent) to the first device doping region 306 or adjacent (e.g. directly adjacent) to the lower doped region 309 of the first device doping region 306, for example. The drift region 413 of the second device doping region 307 may be a lightly doped region of the second conductivity type (e.g. an n− doped region). The drift region 413 of the second device doping region 307 may have an average doping concentration of less than $1 \times 10^{16}$ dopant atoms per cm$^3$ (or e.g. between $1 \times 10^{13}$ dopant atoms per cm$^3$ and $1 \times 10^{16}$ dopant atoms per cm$^3$ or between $2 \times 10^{13}$ cm3 and $5 \times 10^{14}$ cm$^3$.).

The second device doping region 307 may include an optional field stop region 414 arranged between the drift region 413 of the second device doping region 307 and the highly doped region 412 of the second device doping region 307. For example, the field stop region 414 of the second device doping region 307 may be directly adjacent to the drift region 413 of the second device doping region 307 and the highly doped region 412 of the second device doping region 307. The field stop region 414 may have the second conductivity type (e.g. an n doped region). The field stop region 414 of the second device doping region 307 may have an average doping concentration of less than $1 \times 10^{17}$ dopant atoms per cm$^3$ (or e.g. between $1 \times 10^{15}$ dopant atoms per cm$^3$ and $1 \times 10^{17}$ dopant atoms per cm$^3$), for example.

The semiconductor device 400 may further include a further (or back side) contact structure 415 arranged on the second side surface 208 of the semiconductor substrate 102, for example. The further contact structure 415 may be a back side metallization structure, for example. The back side metallization structure may be a single continuous metallization structure arranged on (e.g. directly on) the second side surface 208. The back side metallization structure may cover the whole of the back side surface of the semiconductor substrate or more than 80% of the back side surface of the semiconductor substrate, for example.

The electrical device arrangement of the semiconductor device 400 may be a diode arrangement (e.g. a SPEED diode arrangement), for example. The first device doping region 306 may be a (first) cathode/anode region of the diode arrangement and the second device doping region may be a (second) cathode/anode region of the diode arrangement, for example.

Surge current ability in the semiconductor device 400 may be increased due to structuring of the anode or cathode regions. For example, the NTC portion 104 arranged adjacent to or on the highly doped regions 101 of the first device doping region 306 may increase the surge current capability. For example, at low current density 410 (e.g. normal currents or e.g. not more than two times the nominal current $I_{nom}$), the emitter efficiency may be small to ensure small loses in reverse recovery, to improve robustness and reduce switching losses of the diode device arrangement. The current is therefore not conducted (or guided) over the highly doped regions 101 (e.g. the p+ regions) of the first device doping region 306. At high current density 420, a critical temperature (e.g. of at least 170° C. or e.g. between 170° C. and 250° C.) may be reached. The NTC material of the NTC portion 104 of the contact structure 103 may become highly conductive at the critical temperature, and the current flow through or in the highly doped regions 101 of the first device doping region 306 may increase. The emitter efficiency of the highly doped regions 101 may be increased at high current density 420. For example, more holes may be injected at the anode side, for example. The current flow in the highly doped regions 101 may increase and the forward voltage drop for a given current (or power) may be reduced, for example.

More details and aspects are mentioned in connection with the embodiments described above or below. The embodiments shown in FIG. 4 may comprise one or more optional additional features corresponding to one or more aspects mentioned in connection with the proposed concept or one or more embodiments described above (e.g. FIGS. 1 to 3) or below (e.g. FIGS. 5 to 14).

Figure 5:
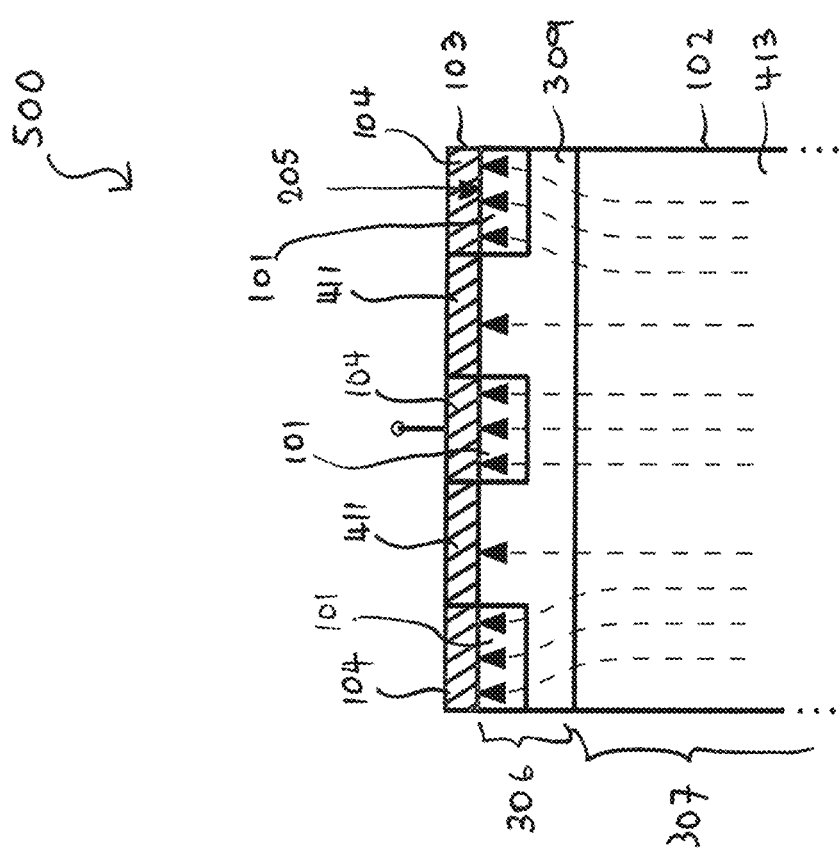
FIG. 5 shows a schematic illustration of a semiconductor device comprising an ohmic material and an NTC material.

FIG. 5 shows a schematic illustration of a semiconductor device 500 according to an embodiment.

The semiconductor device 500 may be similar to the semiconductor device 400 described in connection with FIG. 4, for example. For example, the semiconductor device 500 may include one or more NTC portions 104 including NTC material arranged over the highly doped regions (e.g. the $p^+$ doped regions) of a SPEED diode structure arrangement for increased surge current ability.

The semiconductor device 500 may include the contact structure 103 comprising the NTC portion 104 arranged adjacent to the at least one highly doped region 101 at the first side surface 205 of the semiconductor substrate 102. The NTC portion comprises a negative temperature coefficient of resistance material The contact structure 103 may include one or more ohmic contact portions 411 arranged laterally adjacent to the NTC portions 104 of the contact structure 103. For example, the ohmic contact portions 411 may be arranged between neighboring NTC portions 104 of the contact structure 103. The one or more ohmic contact portions 411 may include ohmic material for forming an ohmic contact with the lower doped region 309 of the first device doping region 306 (e.g. a first cathode/anode region or e.g. an anode) at the first side surface 205 of the semiconductor substrate 102, for example.

It may be understood that the NTC portions 104 may be formed at least partially on a portion of the lower doped regions 309 due to alignment errors or inaccuracies, for example.

The semiconductor device 500 may further include the second device doping region 307 which may include the drift region 413 arranged adjacent (e.g. directly adjacent) to the first device doping region 306 or adjacent to lower doped region 309 of the first device doping region 306, for example.

More details and aspects are mentioned in connection with the embodiments described above or below. The embodiments shown in FIG. 5 may comprise one or more optional additional features corresponding to one or more aspects mentioned in connection with the proposed concept or one or more embodiments described above (e.g. FIGS. 1 to 4) or below (e.g. FIGS. 6 to 14).

Figure 6:
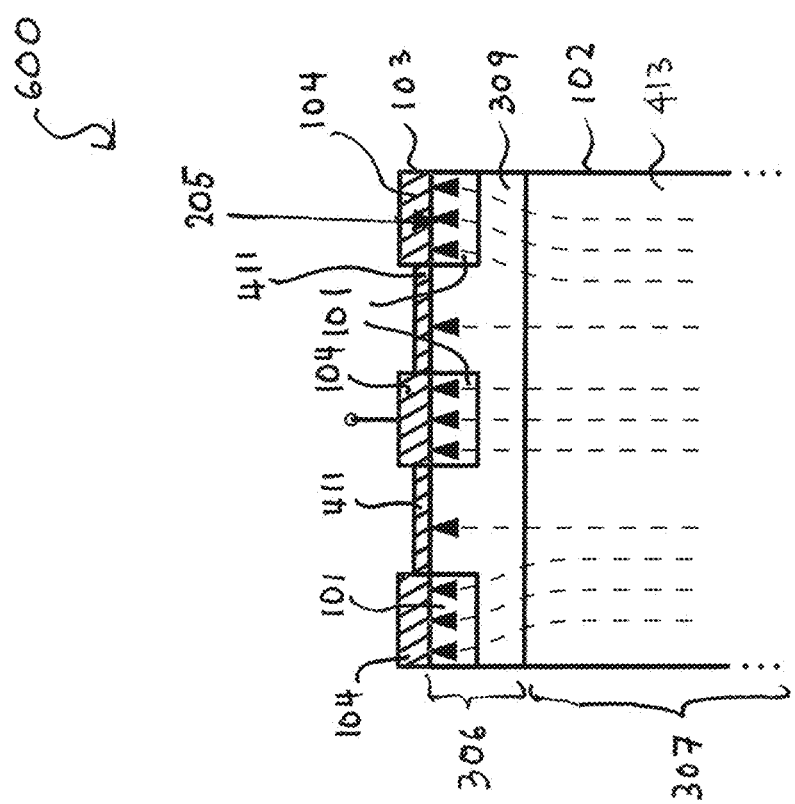
FIG. 6 shows a schematic illustration of a semiconductor device comprising a Schottky material and an NTC material.

FIG. 6 shows a schematic illustration of a semiconductor device 600 according to an embodiment.

The semiconductor device 600 may include the contact structure 103 comprising the NTC portion 104 comprising a negative temperature coefficient of resistance material arranged adjacent to the at least one highly doped region 101 at the first side surface 205 of the semiconductor substrate 102.

The semiconductor device 600 may be similar to the semiconductor device 500 described in connection with FIG. 5, except that the contact structure 103 includes one or more Schottky contact portions 411 instead of the one or more ohmic contact portions, for example. For example, the NTC material may be combined with (or used in combination with) another semiconductor substrate. For example, the ohmic contact of a SPEED structure may be replaced with a Schottky contact material.

The one or more Schottky contact portions 411 may be arranged laterally adjacent to the NTC portions 104 of the contact structure 103. For example, the Schottky contact portions 411 may be arranged between neighboring NTC portions 104 of the contact structure 103. The one or more Schottky contact portions 411 may include Schottky contact material for forming a Schottky barrier contact with the lower doped region 309 of the first device doping region 306 (e.g. a first cathode/anode region or e.g. an anode) at the first side surface 205 of the semiconductor substrate 102, for example.

More details and aspects are mentioned in connection with the embodiments described above or below. The embodiments shown in FIG. 6 may comprise one or more optional additional features corresponding to one or more aspects mentioned in connection with the proposed concept or one or more embodiments described above (e.g. FIGS. 1 to 5) or below (e.g. FIGS. 7 to 14).

Figure 7:
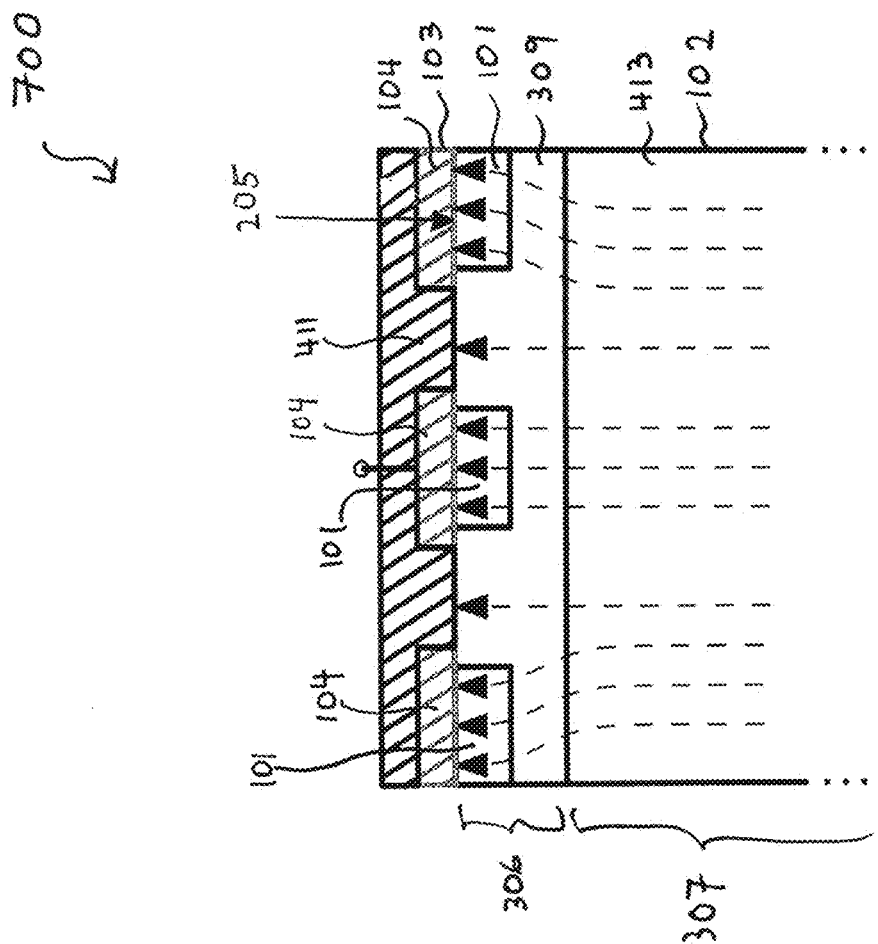
FIG. 7 shows a schematic illustration of a semiconductor device comprising a low band gap material.

FIG. 7 shows a schematic illustration of a semiconductor device 700 according to an embodiment.

The semiconductor device 700 may be similar to the semiconductor device 500 described in connection with FIG. 5. Additionally or optionally, the semiconductor device 700 may include a semiconductor (NTC) material with low band gap (e.g. Ge) embedded in a metallization structure. The semiconductor (NTC) material may be arranged on the highly doped regions (e.g. the p⁺ regions) of a SPEED diode structure arrangement to improve or increase surge current ability.

The contact structure 103 may include one or more Schottky or ohmic contact portions 411 arranged laterally adjacent to the NTC portions 104 of the contact structure 103. At least part of the Schottky or ohmic contact portion 411 of the contact portion 103 may be arranged between neighboring NTC portions 104 of the contact structure 103. A further part of the Schottky or ohmic contact portion 411 may be arranged vertically on (e.g. directly on) the NTC portions 104 of the contact structure 103, for example. For example, the NTC portions 104 of the contact structure may be embedded in the Schottky or ohmic contact portion 411 of the contact structure 103. The Schottky or ohmic contact portions 411 may be a continuous electrically conductive (e.g. metallic) structure, for example.

The introduction of the metallization layers (e.g. the Schottky or ohmic contact portion 411) may be carried out by evaporation or sputtering, and structuring technique. The metallization formed on the low doped regions and may also be formed over the NTC metallization (e.g. the Schottky contact metallization), for example.

The Schottky or ohmic contact portion 411 may be an ohmic contact portion which may include ohmic material (e.g. one or more metal layers) for forming an ohmic contact with the lower doped region 309 of the first device doping region 306 (e.g. a first cathode/anode region or e.g. an anode) at the first side surface 205 of the semiconductor substrate 102, for example.

Optionally or alternatively, the metallizations (or materials) may include a Schottky material, so that in the region of the highly doped regions 101 a Schottky contact may be formed, so that the temperature dependency of the redistribution of the current flow at high current densities may be guaranteed or sustained, for example.

The NTC material of the NTC portion 104 may be (or may include) a semiconductor material having a bandgap energy less than a bandgap energy of silicon. For example, the NTC material of the NTC portion 104 may include or may be germanium (Ge) which may have a band gap of 0.66 eV at 300K. The semiconductor material with low bandgap may be used in thermistors, for example. The intrinsic conductivity of the respective material at high temperature may be used, for example.

Additionally, optionally or alternatively, the NTC material of the NTC portion 104 may include metal oxide which may be used as an NTC material. Optionally, the NTC material of the NTC portion 104 may include a mixture of metal oxides and germanium. For example, the NTC material of the NTC portion 104 may include magnesium oxide (MgO), titanium oxide (TiO), magnesium nickel oxide (Mg—NiO) or cobalt (Co), or mixtures of these materials. For example, the NTC material of the NTC portion 104 may include a mixture of MgO and TiO and optionally or additionally, Co. Alternatively, the NTC material of the NTC portion 104 may include Mg—NiO and optionally or additionally, Co.

More details and aspects are mentioned in connection with the embodiments described above or below. The embodiments shown in FIG. 7 may comprise one or more optional additional features corresponding to one or more aspects mentioned in connection with the proposed concept or one or more embodiments described above (e.g. FIGS. 1 to 6) or below (e.g. FIGS. 8 to 14).

Figure 8:
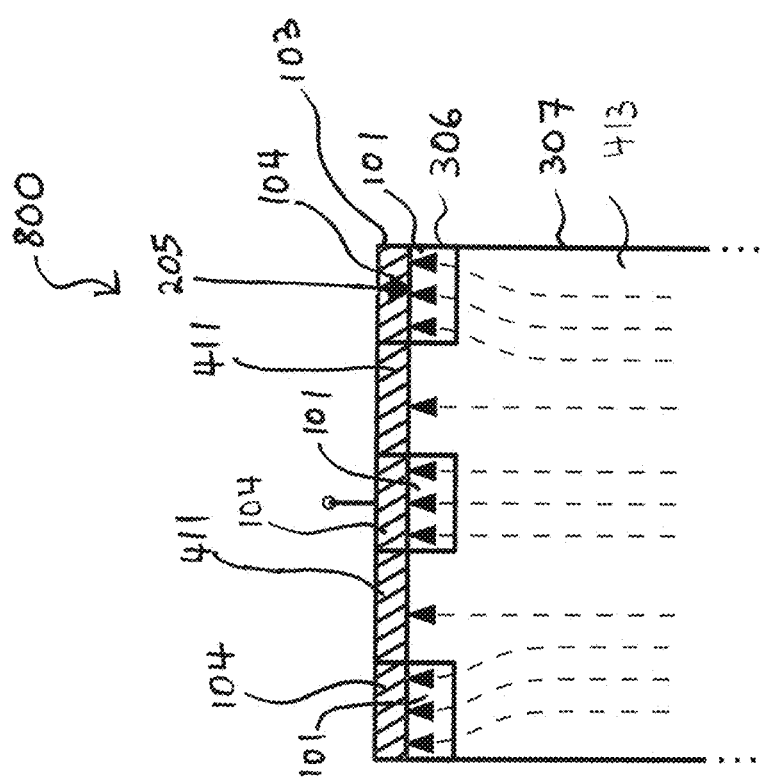
FIG. 8 shows a schematic illustration of a semiconductor device comprising a MPS diode arrangement and an NTC material.

FIG. 8 shows a schematic illustration of a semiconductor device 800 according to an embodiment.

The semiconductor device 800 may include at least one highly doped region 101 (e.g. one or more highly doped regions 101) of an electrical device arrangement formed in a semiconductor substrate 102. The highly doped regions 101 having the first conductivity type (e.g. p+ doped regions) may be part of a first device doping region 306 of the electrical device arrangement, for example. The electrical device arrangement of the semiconductor device 800 may be a diode arrangement (e.g. a MPS diode arrangement), for example. The first device doping region 306 (e.g. the highly doped regions 101 may be a first cathode/anode region of the diode arrangement, for example).

The semiconductor device 800 may further include the second device doping region 307 having the second conductivity type (e.g. n type doped). The second device doping region 307 may include the drift region 413 arranged adjacent (e.g. directly adjacent) to the first device doping region 306, for example. The drift region 413 of the second device doping region 307 may be a lightly doped region of the second conductivity type (e.g. an n-doped region). At least part of the drift region 413 of the second device doping region 307 may be arranged at the first side surface 205 of the semiconductor substrate 102 between neighboring highly doped regions 101 of the first device doping region 306, for example.

The contact structure 103 may further include at least one Schottky or ohmic contact portion 411 (e.g. one or more Schottky or ohmic contact portions 411) arranged laterally adjacent to the NTC portions of the contact structure 103. The Schottky or ohmic contact portions 411 may be formed directly adjacent or on the drift regions 413 of the second device doping region 307 at the first side surface 205 of the semiconductor substrate 102, for example. Additionally or optionally, further doped region (e.g. n doped regions) may be located between the ohmic contact portions and the drift regions 413 of the second device doping region 307, for example.

The semiconductor device 800 may include a MPS structure with NTC materials in proximity to or adjacent to the highly doped regions 101 (e.g. the p+ regions). The semiconductor substrate 102 may include a silicon carbide-based substrate and the semiconductor device 800 may include an SiC-based diode arrangement, for example. At low current density, current flowing through the highly doped regions 101 may be lower as charge carriers may have to cross a larger barrier at the p+– n-junction. At low current density, the current flows through the n channels (e.g. the Schottky areas) defined by the drift regions 413 (e.g. through the n– regions), for example. At high currents, the structure may be bipolar and the main part of the current may be guided through or over the highly doped regions 101 (e.g. the p+ regions). In these highly doped regions, high temperatures may be expected during surge currents and using NTC material in the NTC portions 104 as part of the metallization contact structure 103 may improve the surge current reliability, for example. With SiC diodes, an MPS diode structure arrangement may be used to increase the surge current ability, for example.

More details and aspects are mentioned in connection with the embodiments described above or below. The embodiments shown in FIG. 8 may comprise one or more optional additional features corresponding to one or more aspects mentioned in connection with the proposed concept or one or more embodiments described above (e.g. FIGS. 1 to 7) or below (e.g. FIGS. 9 to 14).

Figure 9:
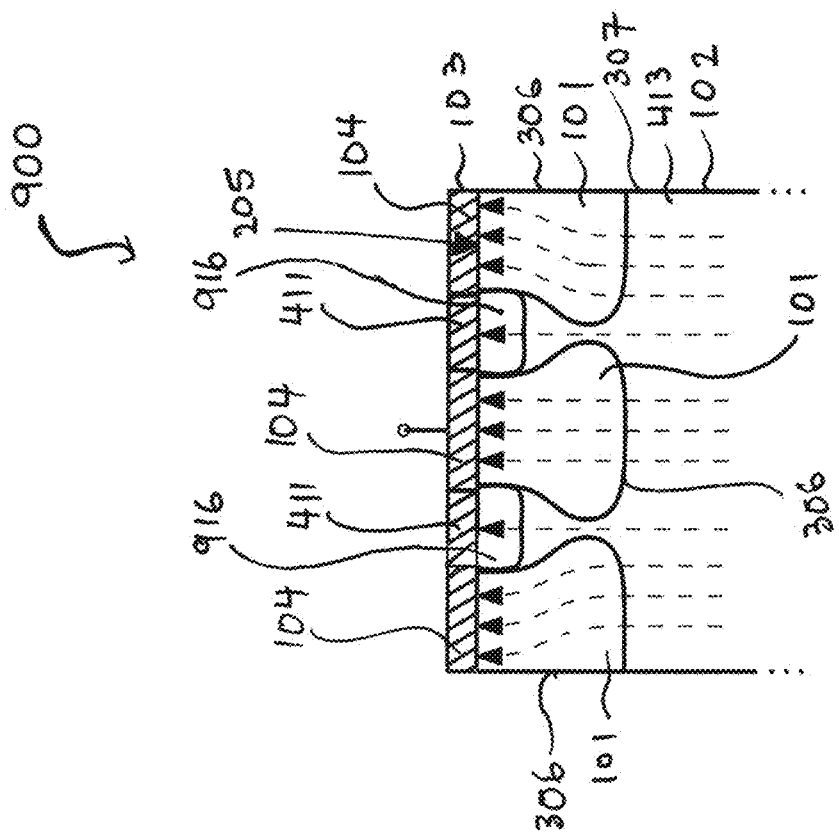
FIG. 9 shows a schematic illustration of a semiconductor device comprising an IDEE diode arrangement and an NTC material.

FIG. 9 shows a schematic illustration of a semiconductor device 900 according to an embodiment.

The semiconductor device 900 may include at least one highly doped region 101 (e.g. one or more highly doped regions 101) of an electrical device arrangement formed in a semiconductor substrate 102. The highly doped regions 101 having the first conductivity type (e.g. p+ doped regions) may be part of a first device doping region 306 of the electrical device arrangement, for example. The electrical device arrangement of the semiconductor device 900 may be a diode arrangement (e.g. an IDEE diode arrangement), for example. The first device doping region 306 (e.g. the highly doped regions 101) may be a first cathode/anode region of the diode arrangement, for example.

The semiconductor device 900 may further include the second device doping region 307 having the second conductivity type (e.g. n type doped). The second device doping region 307 may include the drift region 413 arranged adjacent (e.g. directly adjacent) to the first device doping region 306, for example. The drift region 413 of the second device doping region 307 may be a lower doped region of the second conductivity type (e.g. an n-doped region). At least part of the drift region 413 of the second device doping region 307 may be arranged between neighboring highly doped regions 101 of the first device doping region 306, for example.

The second device doping region 307 may further include at least one (second) highly doped region 916 (e.g. a plurality of second highly doped regions 916) located at the first side surface 205 of the semiconductor substrate 102. Each (second) highly doped region 916 (e.g. n+ doped region) of the second device doping region 307 may be located laterally adjacent to the highly doped regions 101 or between neighboring highly doped regions 101 at the first side surface 205 of the semiconductor substrate 102, for example.

The at least one (second) highly doped region 916 of the second device doping region 307 may have an average doping concentration of more than $1 \times 10^{18}$ dopant atoms per $cm^3$ (or e.g. between $1 \times 10^{18}$ dopant atoms per $cm^3$ and $4 \times 10^{20}$ dopant atoms per $cm^3$), for example.

The contact structure 103 may further include at least one Schottky or ohmic contact portion 411 (e.g. one or more Schottky or ohmic contact portions 411) arranged laterally adjacent to the NTC portions of the contact structure 103. The Schottky or ohmic contact portions 411 may be formed directly adjacent or on the (second) highly doped regions 916 (e.g. n+ regions) of the second device doping region 307 at the first side surface 205 of the semiconductor substrate 102, for example.

The semiconductor device 900 may include an IDEE diode structure arrangement with NTC materials in proximity or adjacent to the highly doped regions 101 (e.g. the p+ regions). At low current density, current flowing through the highly doped regions 101 may be lower as charge carriers may have to cross a larger barrier at the p+– n-junction. At low current density, the current flows through the n channels defined by the drift regions 413 (e.g. through the n– regions) and the (second) highly doped regions 916 (e.g. n+ regions) of the second device doping region 307, for example. At high currents, the current may be guided through or over the highly doped regions 101 (e.g. the p+ regions) of the first device doping region 306, for example.

The surge current ability of the IDEE diode arrangement may be improved by using an NTC material in proximity to the highly doped p+ region, for example.

More details and aspects are mentioned in connection with the embodiments described above or below. The embodiments shown in FIG. 9 may comprise one or more optional additional features corresponding to one or more aspects mentioned in connection with the proposed concept or one or more embodiments described above (e.g. FIGS. 1 to 8) or below (e.g. FIGS. 10 to 14).

Figure 10:
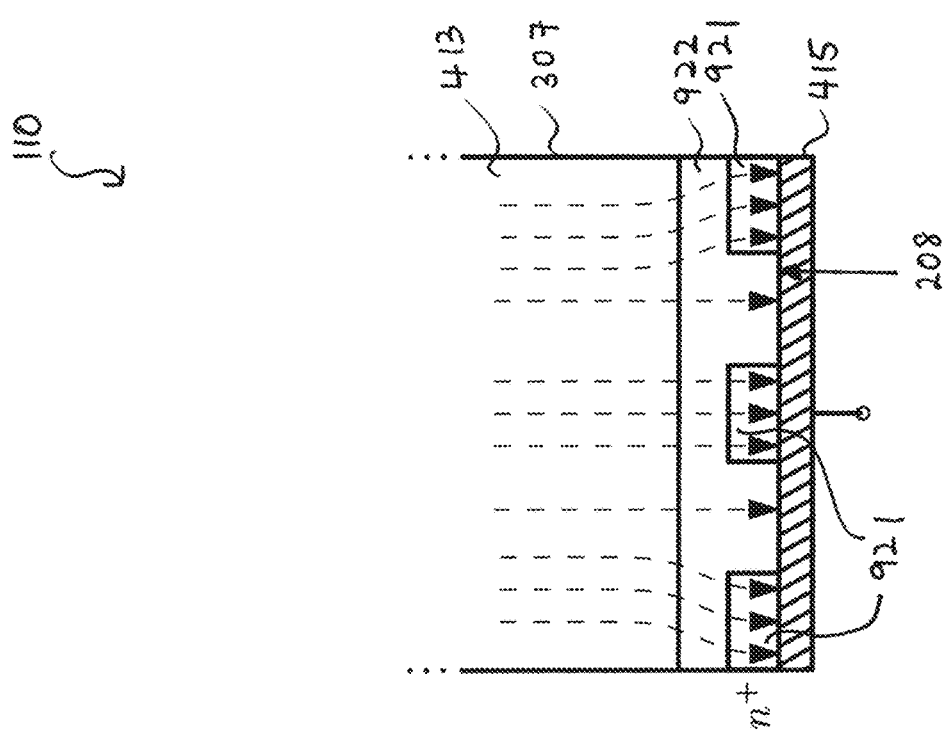
FIG. 10 shows a schematic illustration of side of a further semiconductor device comprising an NTC material.

FIG. 10 shows a schematic illustration of a semiconductor device 110 according to an embodiment. FIG. 10 shows current flow in a pin-diode arrangement with a cathode side structure at high current density, for example.

The semiconductor device 110 may include the second device doping region 307. At least part of the second device doping region 307 may be located directly adjacent or at a second side surface 208 of the semiconductor substrate 102, for example.

The second device doping region 307 may include at least one (first) highly doped region 921 (e.g. one or more first highly doped regions 921) having the second conductivity type arranged at the second side surface 208 of the semiconductor substrate 102. The at least one (first) highly doped region 921 of the second device doping region 307 may have an average doping concentration of more than $1 \times 10^{18}$ dopant atoms per $cm^3$ (or e.g. between $1 \times 10^{18}$ dopant atoms per $cm^3$ and $4 \times 10^{20}$ dopant atoms per $cm^3$), for example.

The second device doping region 307 may further include a lower doped region 922 having the second conductivity type laterally surrounding the (first) highly doped regions 921 of the second device doping region 307 at the second side surface 208 of the semiconductor substrate 102, for example. The lower doped region 922 of the second device doping region 307 may be formed adjacent or directly adjacent to the (first) highly doped regions 921 of the second device doping region 307 in a direction substantially parallel to the first side surface 205 or the second side surface 208 of the semiconductor substrate 102, for example. For example, the lower doped region 922 of the second device doping region 307 may be formed laterally adjacent to the highly doped regions 921 of the second device doping region 307 or between neighboring highly doped regions 921 of the second device doping region 307.

The lower doped region 922 of the second device doping region 307 may have an average doping concentration of less than $1 \times 10^{17}$ dopant atoms per $cm^3$ (or e.g. between $1 \times 10^{15}$ dopant atoms per $cm^3$ and $1 \times 10^{17}$ dopant atoms per $cm^3$), for example.

The lower doped region 922 of the second device doping region 307 may be arranged directly adjacent to the drift region 413 of the second device doping region 307, for example. The lower doped region 922 of the second device doping region 307 may have a higher average doping concentration than the drift region 413 of the second device doping region 307, for example.

The semiconductor device 110 may further include a further (or back side) contact structure 415 arranged on the second side surface 208 of the semiconductor substrate 102, for example. The further contact structure 415 may be a back side metallization structure, for example. The back side metallization structure may be a single continuous metallization structure arranged on (e.g. directly on) the second side surface 208. The back side metallization structure may cover the whole of the back side surface of the semiconductor substrate or more than 80% of the back side surface of the semiconductor substrate, for example. The further contact structure 415 may be an electrically conductive electrode structure (e.g. a cathode structure) for providing a voltage to (or providing a current to or from) the second device doping region 307 at the second side surface 208 of the semiconductor substrate 102, for example.

The cathode side (e.g. the second device doping region 307) may also be structured, so that in normal operation, the plasma density is lowered at the back side, for example. In the case of surge current a large part of the current may be conducted over the n+ region. The back side emitter may be dependent on the current and/or the temperature.

The electrical device arrangement may be a diode arrangement (e.g. a MPS diode arrangement, a SPEED diode, an (inverse injection dependency of emitter efficiency) IDEE diode arrangement, or a Schottky controlled injection diode), for example. Back side structured semiconductors may improve their surge current ability if an NTC material is introduced in proximity to or adjacent to the (first) highly doped regions (the n+ regions). Furthermore, the surge current capability may be further improved if a PTC material is introduced in proximity to or adjacent to the lower doped regions located between the highly doped regions.

More details and aspects are mentioned in connection with the embodiments described above or below. The embodiments shown in FIG. 10 may comprise one or more optional additional features corresponding to one or more aspects mentioned in connection with the proposed concept or one or more embodiments described above (e.g. FIGS. 1 to 9) or below (e.g. FIGS. 11 to 14).

Figure 11:
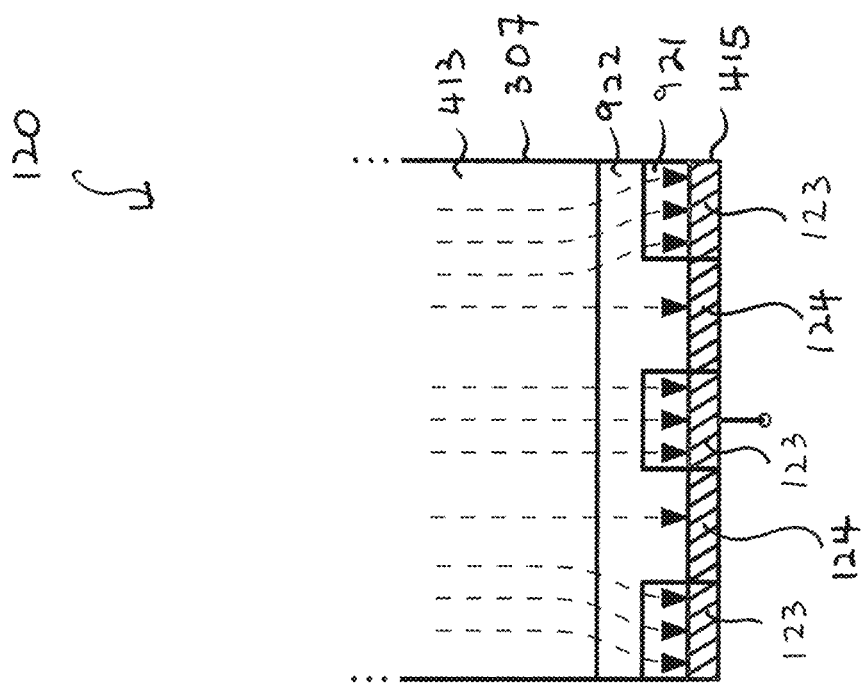
FIG. 11 shows a schematic illustration of a contact structure of a further semiconductor device comprising an NTC material.

FIG. 11 shows a schematic illustration of a semiconductor device 120 according to an embodiment.

The semiconductor device 120 may be similar to the semiconductor device 110 described in connection with FIG. 10. Additionally or optionally, the further contact structure 415 arranged on the second side surface 208 of the semiconductor substrate 102 may include one or more NTC portions 123. Each NTC portion 123 of the further contact structure 415 may include NTC material arranged adjacent to the (first) highly doped regions 921 of the second device doping region 307.

The further contact structure 415 may further include one or more Schottky or ohmic contact portions 124 (or PTC contact portions comprising PTC material) arranged laterally adjacent to the NTC portions 123 of the further contact structure 415. The one or more Schottky or ohmic contact portions 124 may be arranged adjacent to the lower doped region 922 of the second device doping region 307 at the second side surface 208 of the semiconductor substrate 102, for example.

The semiconductor device 120 may include NTC material arranged on the second side surface 208 (e.g. the back side) of the semiconductor substrate 102 in proximity to or adjacent to the highly doped regions 921 (e.g. n+ doped regions) of the second device doping region 307 of the back side structured diode.

More details and aspects are mentioned in connection with the embodiments described above or below. The embodiments shown in FIG. 11 may comprise one or more optional additional features corresponding to one or more aspects mentioned in connection with the proposed concept or one or more embodiments described above (e.g. FIGS. 1 to 10) or below (e.g. FIGS. 12 to 14).

Figure 12:
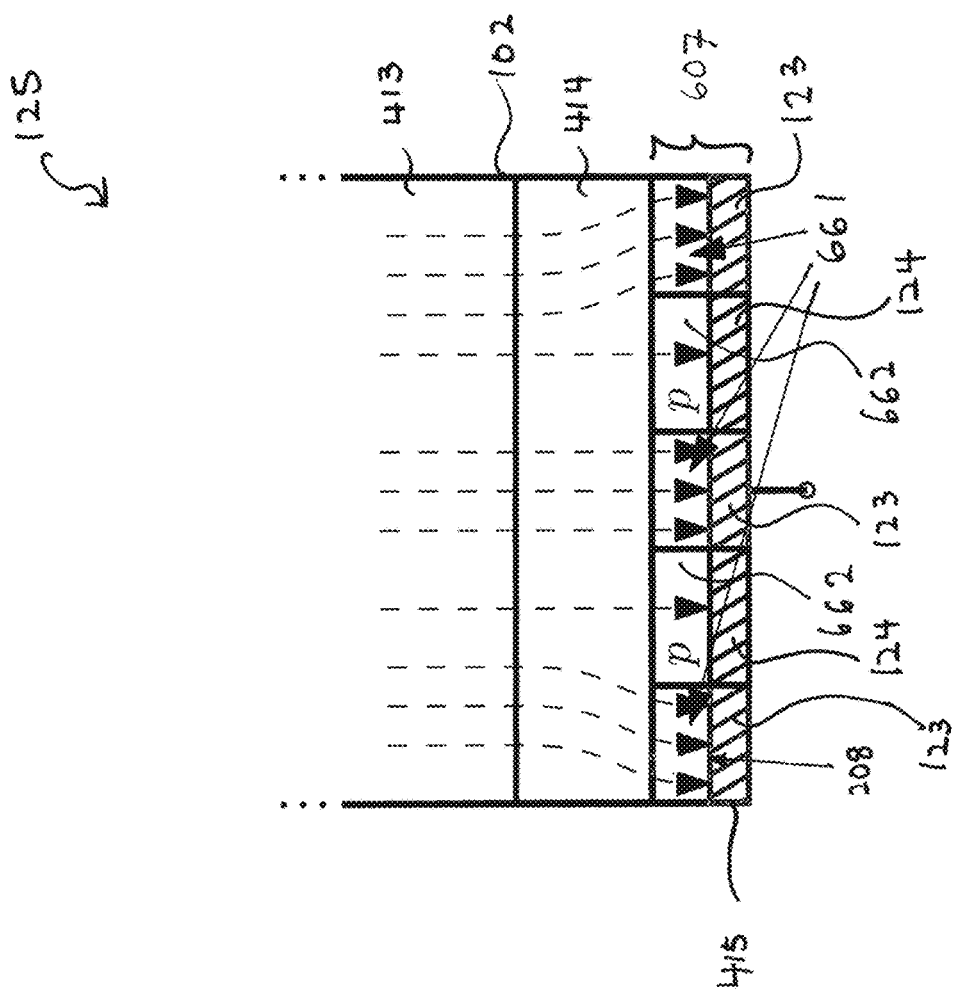
FIG. 12 shows a schematic illustration of a semiconductor device transistor arrangement comprising an NTC material.

FIG. 12 shows a schematic illustration of a semiconductor device 125 according to an embodiment.

The semiconductor device 125 may include at least one device doping region 607 (e.g. a collector region of an IGBT electrical device arrangement) arranged at a back side surface of the semiconductor substrate 102, for example. The semiconductor device 125 may include an IGBT arrangement including a SPEED collector structure, for example.

The device doping region 607 (e.g. the collector region) may include one or more highly doped regions 661 arranged laterally at the back side surface 208 of the semiconductor substrate 102, for example. The device doping region 607 may further include one or more lower doped portions 662 having the same conductivity type as the highly doped regions 661 of the device doping region 607 laterally surrounding the one or more highly doped regions 661 of the device doping region 607, for example.

The collector region (e.g. the device doping region 607) of the IGBT arrangement may have the first conductivity type or the second conductivity type, for example. For example, the device doping region 607 (e.g. including the highly doped regions 661 and the lower doped portions 662) may have an n-type doping or a p-type doping.

In an example, highly doped regions 661 may have a p++ doping and the lower doped portions 662 may have a p doping. The semiconductor device 125 may further include a lightly doped drift region 413 of an opposite conductivity type to the collector region (e.g. an n− doped region). The drift region 413 may be arranged between an optional field stop region 414 and a body region of the IGBT arrangement, for example. The optional field stop region 414 (e.g. an n doped region) may be arranged between the drift region 413 and the collector region (e.g. the device doping region 307), for example.

The highly doped regions 661 may have an average doping concentration of more than $1\times10^{19}$ dopant atoms per $cm^3$ (or e.g. between $1\times10^{19}$ dopant atoms per $cm^3$ and $1\times10^{21}$ dopant atoms per $cm^3$). The lower doped portions 662 of the first device doping region may have an average doping concentration of less than $1\times10^{17}$ dopant atoms per $cm^3$ (or e.g. between $1\times10^{16}$ dopant atoms per $cm^3$ and $1\times10^{17}$ dopant atoms per $cm^3$). The drift region 413 of the second device doping region 307 may have an average doping concentration of less than $1\times10^{16}$ dopant atoms per $cm^3$ (or e.g. between $1\times10^{13}$ dopant atoms per $cm^3$ and $1\times10^{16}$ dopant atoms per $cm^3$). The field stop region 414 of the second device doping region 307 may have an average doping concentration of less than $1\times10^{17}$ dopant atoms per $cm^3$ (or e.g. between $1\times10^{16}$ dopant atoms per $cm^3$ and $1\times10^{17}$ dopant atoms per $cm^3$), for example.

The semiconductor device 125 may further include a contact structure 415 arranged on the back side surface 208 of the semiconductor substrate 102. The contact structure 415 may include one or more NTC portions 123. Each NTC portion 123 of the further contact structure 415 may include NTC material arranged adjacent to the highly doped regions 921 of the device doping region 607. The highly doped regions 661 (e.g. the p++ regions) of the IGBT device arrangement with a SPEED collector may be covered with the NTC portions 123 (e.g. the NTC material). This may increase short circuit robustness, which may be strengthened in high temperature conditions at the back side emitter and may counter or prevent fluctuations in field strength, current densities, or breakdown voltage with changing current densities in the IGBT device arrangement.

The further contact structure 415 may further include one or more Schottky or ohmic contact portions 124 arranged laterally adjacent to the NTC portions 123 of the further contact structure 415. The one or more Schottky or ohmic contact portions 124 may be arranged adjacent to the lower doped regions 622 of the device doping region 607 at the back side surface 208 of the semiconductor substrate 102, for example.

More details and aspects are mentioned in connection with the embodiments described above or below. The embodiments shown in FIG. 12 may comprise one or more optional additional features corresponding to one or more aspects mentioned in connection with the proposed concept or one or more embodiments described above (e.g. FIGS. 1 to 11) or below (e.g. FIGS. 13A to 14).

Figure 13A:
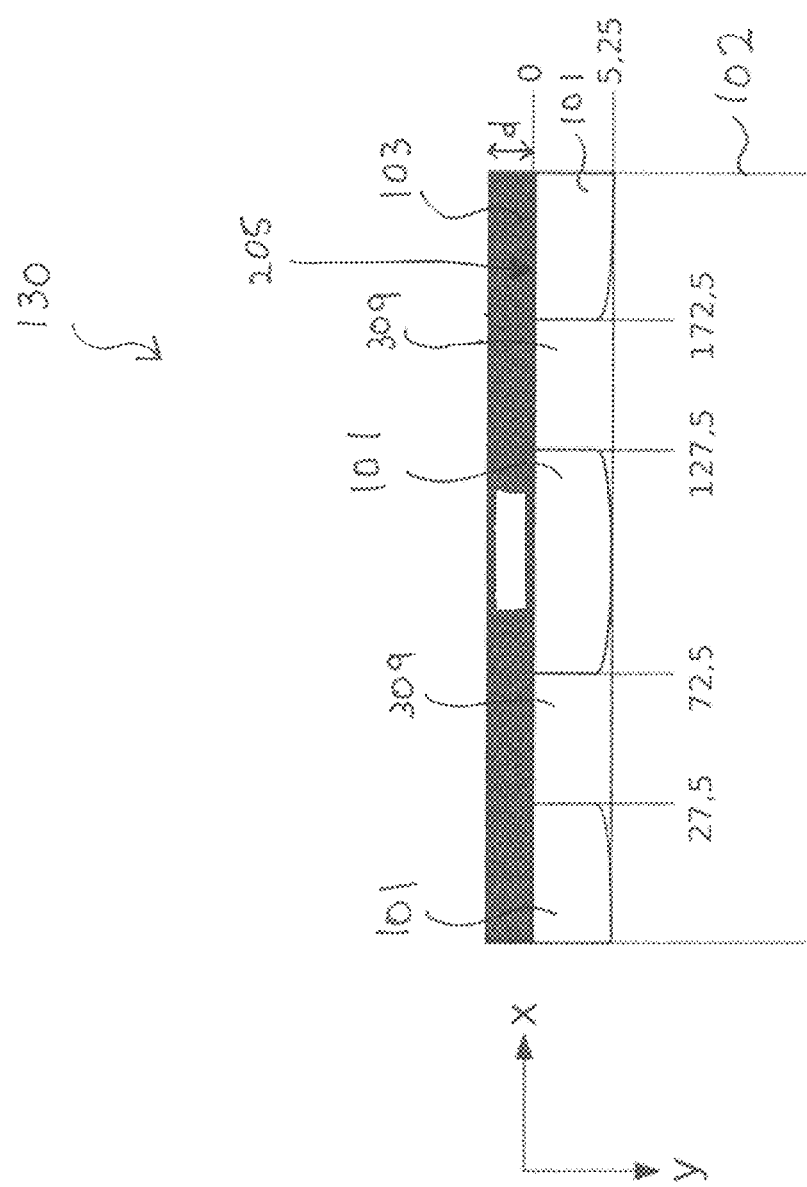
FIG. 13A shows a schematic illustration of possible dimensions of device doping regions of a semiconductor device.
Figure 13B:
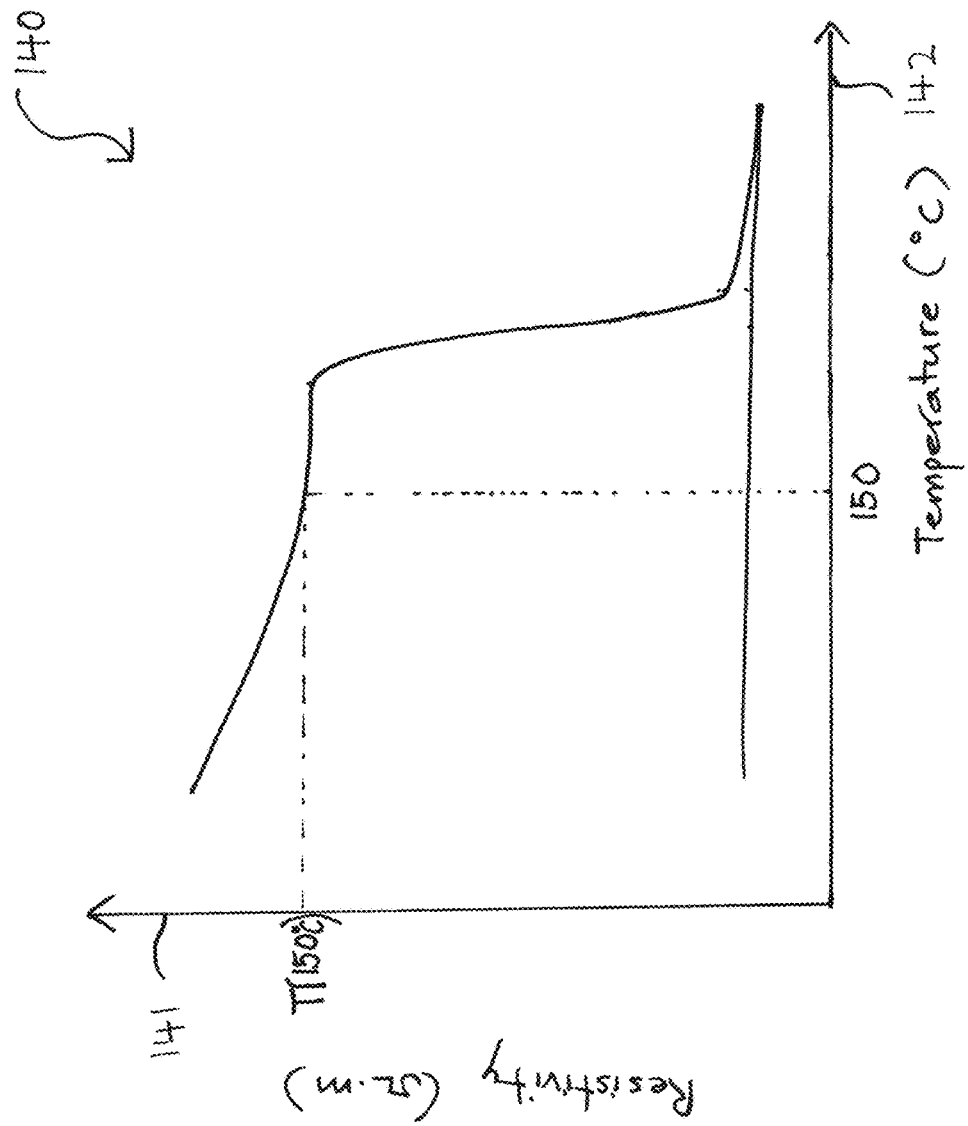
FIG. 13B shows a diagram of a resistivity behavior of an NTC material used in a semiconductor device.
Figure 13C:
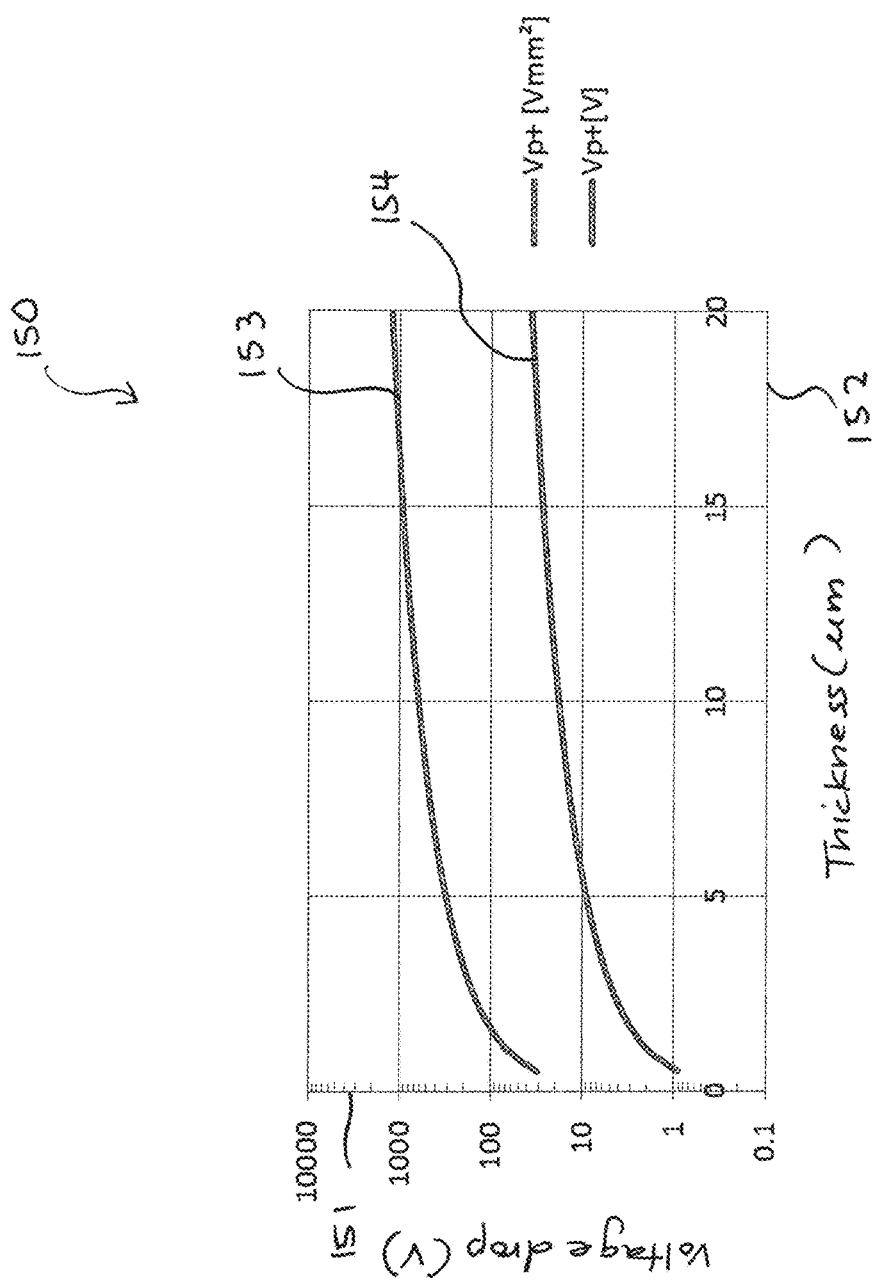
FIG. 13C shows a diagram of a voltage drop in relation to thickness of an NTC portion of a contact structure of a semiconductor device.

FIGS. 13A to 13C show a variation in the resistance and voltage drop in a semiconductor device in relation to a thickness of the NTC materials in the semiconductor device, for example.

FIG. 13A shows a schematic illustration of a semiconductor device 130 according to an embodiment.

The semiconductor device 130 may include an electrical device arrangement which may be a diode arrangement (e.g. a SPEED diode arrangement).

The semiconductor device 130 may include a plurality of highly doped regions 101 (e.g. p+ doped regions or n+ doped regions) and one or more lower doped regions 309 (e.g. p doped regions or n doped regions) of the same conductivity type laterally surrounding the highly doped regions 101 in a semiconductor substrate 102. Each lower doped region 309 may have a maximum lateral dimension of greater than 50 µm, for example. The maximum lateral dimension of the highly doped region 101 may be a largest dimension or size of the highly doped region 101 measured in a direction substantially parallel to a first side surface 205 of the semiconductor substrate (e.g. in the x-direction), for example. The maximum lateral dimension of the lower doped region 309 may be a largest dimension or size of the lower doped region 309 measured between neighboring highly doped regions 101 in a direction substantially parallel to a first side surface 205 of the semiconductor substrate (e.g. in the x-direction), for example. Each highly doped region 101 may have a maximum lateral dimension of greater than 100 µm, for example.

The semiconductor device 130 may have a nominal or rated current of between 50 A and 60 A (or e.g. about 62.5 A), for example. The semiconductor device 130 may have a nominal or rated current density of approximately 100 A per cm² and an active area of approximately 0.61 cm². A cross-sectional area of one lower doped region 309 (the p region) of an area of the lower doped region 309 substantially parallel to the first side surface 205 of the semiconductor substrate 102 may be approximately 0.27 cm², for example. A cross-sectional area of one highly doped region 101 (the p+ region) of an area of the highly doped region 101 substantially parallel to the first side surface 205 of the semiconductor substrate 102 may be approximately 0.34 cm², for example. A specific resistance of an aluminum or aluminum based contact structure 103 may be $2.65 \times 10^{-2}$ $\Omega \cdot mm^2$ per meter, for example. The cross-sectional areas may be substantially parallel to the first side surface 205 of the semiconductor substrate (e.g. in the x-direction), for example.

FIG. 13B shows a diagram 140 of a resistivity behavior of an NTC material of the NTC portion of the contact structure according to an embodiment. FIG. 13B shows a variation of resistivity ($\Omega m$) 141 with temperature (° C.) 142, for example.

The NTC material may be a phase change material comprising GeTe, for example. Below a phase transition temperature (e.g. below 170° C.), the NTC material of the NTC portion 104 may exhibit significantly poorer conductivity (or e.g. a high resistivity). When surge currents occur, higher temperatures may be experienced by the NTC material. The NTC material may have a variable electrical resistivity which may decrease with increasing temperature. For example, the electrical resistivity of the negative temperature coefficient material of the NTC portion changes by at least 50% (or e.g. at least 80%) of its electrical resistivity value at 150° C. T(150° C.) at a temperature interval between 170° C. and 250° C. For example, an electrical resistivity of the negative temperature coefficient material of the NTC portion may reduce to between 0.0005%% and 50% (or e.g. to less than 20%, or e.g. to less than 5%) of its electrical resistivity value at 150° C. at a temperature interval between 170° C. and 250° C. For example, GeTe may be a possible thermistor material which has a sharp resistance decrease (e.g. from 0.2 $\Omega m$ to 0.000006 $\Omega m$) at or above a critical temperature (e.g. above 170° C.).

For example, at 100° C. the NTC material may have an electrical resistivity of about 1 $\Omega m$ (or $1 \times 10^6$ $\Omega m \cdot mm^2/m$) and at 200° C. the NTC material may have an electrical resistivity of about 0.000004 $\Omega m$ (or 4 $\Omega m \cdot mm^2/m$) assuming 1 $\Omega m = 1000\ 000$ $\Omega \cdot mm^2/m$.

Optionally or alternatively, an NTC material including a composite matrix (e.g. of electrically insulation polymer and Ag particles or spheres) may also reduce the voltage drop at higher temperatures. For example, at lower temperatures, the NTC material may have an electrical resistivity of about $10 \times 10^6$ $\Omega m$ ($10 \times 10^{-8}$ S/m or $1 \times 10^{13}$ $\Omega m^* mm^2/m$) and at high temperatures the NTC material may have an electrical resistivity of about $1 \times 10^{-8}$ $\Omega m$ ($10 \times 10^7$ S/m or 0.01 $\Omega m^* mm^2/m$).

Assuming a complete (or maximum) nominal current (62.5 A) passes through the p regions, the resistance of portions of the contact structure may be estimated by $$R_p = \frac{\rho * d}{A}.$$

$R_p$ represents the resistance in the portion of the contact structure, d represents the thickness of the portion of the contact structure and A represents the cross sectional area of the portion of the contact structure, for example.

A resistance, $R_{p^-,Al}$, of a metallic (e.g. an aluminum) portion or ohmic portion of the contact structure located adjacent to a lower doped region (e.g. a p or p– doped region) may lie between $3 \times 10^{-9} \Omega$ and $5 \times 10^{-9} \Omega$, for example. A voltage drop $V_{p^-,Alu}$ in the ohmic portion of the contact structure may lie between 0.1 pV and 0.3 pV, for example. These values may be obtained assuming a specific resistance of an aluminum based contact structure of between $2 \times 10^{-2}$ $\Omega \cdot mm^2$ per meter and $3 \times 10^{-2}$ $\Omega \cdot mm^2$ per meter, a thickness of between 3 µm and 5 µm, and a cross-sectional area (of the ohmic portion of the contact structure contacting the lower doped region) of between 0.5 cm² and 1 cm², for example.

A resistance, $R_{p^+,100°\ C,NTC}$, of an NTC portion of the contact structure at 100° C. or in a low current density operation may lie between 100 mΩ and 1.5 MΩ, for example. A voltage drop, $V_{p^+,100°\ C,NTC}$, in the NTC portion of the contact structure at 100° C. or in a low current density operation may be lie between 5 V and 90 MV, for example. These values may be obtained assuming an electrical resistivity of between $1 \times 10^6$ $\Omega mm^2$ per meter and $1 \times 10^{13}$ $\Omega mm^2$ per meter, a thickness of between 3 µm and 5 µm, and a cross-sectional area (of the NTC portion of the contact structure contacting the highly doped region) of between 0.5 cm² and 1 cm², for example.

A resistance, $R_{p^+,200°\ C,NTC}$, of an NTC portion of the contact structure at 200° C. or in a high current density operation may lie between $1 \times 10^{-9} \Omega$ and $5 \times 10^{-7} \Omega\Omega$, for example. A voltage drop $V_{p+,200°C,NTC}$ in the NTC portion of the contact structure at 200° C. or in a high current density operation may lie between 0.05 μV and 50 μV, for example. These values may be obtained assuming an electrical resistivity of between 0.01 Ωmm² per meter and 5 Ωmm² per meter, a thickness of between 3 μm and 5 μm, and a cross-sectional area (of the NTC portion of the contact structure contacting the highly doped region) of between 0.5 cm² and 1 cm², for example.

FIG. 13C shows a diagram 150 of a voltage drop (V) 151 in an NTC portion of the contact structure in relation to thickness (μm) 152 of the NTC portion of the contact structure. The contact structure may be implemented in a 3.3 kV SPEED diode arrangement and the values derived may assume a nominal current of 62.5 A at 100° C., for example.

The first line 153 shows the voltage drop multiplied by the cross-sectional area at the p+− NTC junction or region in volts×mm² (Vmm²), for example. The second line 154 shows the voltage drop at the p+− NTC junction or region in V (volts). As the voltage drop increases with increasing thickness of the NTC portion of the contact structure, a thickness of the NTC portion of the contact structure may be chosen to avoid larger voltage drops. For example, an NTC portion of the contact structure may be chosen to have a maximal thickness which lies between 0.5 μm and 10 μm (or e.g. between 1 μm and 5 μm, or e.g. between 3 μm and 5 μm).

More details and aspects are mentioned in connection with the embodiments described above or below. The embodiments shown in FIGS. 13A to 13C may comprise one or more optional additional features corresponding to one or more aspects mentioned in connection with the proposed concept or one or more embodiments described above (e.g. FIGS. 1 to 12) or below (e.g. FIG. 14).

FIG. 14 shows a flow chart of a method 170 for forming a semiconductor device according to an embodiment.

The method 170 comprises forming 710 at least one highly doped region of an electrical device arrangement in a semiconductor substrate.

The method 170 further comprises forming at least one NTC portion 720 of a contact structure adjacent to the highly doped region of the electrical device arrangement at a front side surface of the semiconductor substrate. The at least one NTC portion comprises negative temperature coefficient of resistance material.

Due to the forming of the NTC (negative temperature coefficient of resistance) portion comprising negative temperature coefficient of resistance (NTC) material at the front side surface of the semiconductor substrate, the surge current capability of the semiconductor device may be improved, for example. For example, the current flow in the at least one highly doped region may be increased due to the NTC material of the NTC portion becoming highly conductive at a critical temperature. At normal currents and/or temperatures, a forward voltage drop of the semiconductor device for a given current (or power) may be reduced leading to and improved reverse recovery behavior and/or a reduction in switching current losses in the semiconductor device, for example.

More details and aspects are mentioned in connection with the embodiments described above or below. The embodiments shown in FIG. 14 may comprise one or more optional additional features corresponding to one or more aspects mentioned in connection with the proposed concept or one or more embodiments described above (e.g. FIGS. 1 to 13C) or below.

Various examples relate to increasing the surge current reliability and the optimization of short circuits of power components by current controllable or variable emitter efficiency and structured anodes and cathodes, for example.

Aspects and features (e.g. the semiconductor substrate, the at least one highly doped region, the electrical device arrangement, the contact structure, the NTC portion, the NTC material, the front side surface, the back side surface, the device doping region, the first device doping region, the second device doping region, the first cathode/anode region, the second cathode/anode region, and the Schottky or ohmic contact portion) mentioned in connection with one or more specific examples may be combined with one or more of the other examples.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
   at least one highly doped region of an electrical device arrangement formed in a semiconductor substrate; and
   a contact structure comprising an NTC (negative temperature coefficient of resistance) portion arranged adjacent to the at least one highly doped region at a front side surface of the semiconductor substrate, the NTC portion comprising a negative temperature coefficient of resistance material,
   wherein the negative temperature coefficient of resistance material of the NTC portion of the contact structure comprises at least one material selected from the group consisting of a chalcogenide material, a phase change material, germanium, germanium-telluride, a metal oxide, a mixture of metal oxides, a mixture of metal oxides and germanium, and a composite material comprising polymer and metal.

2. The semiconductor device of claim 1, wherein the at least one highly doped region has an average doping concentration of more than $1 \times 10^{18}$ dopant atoms per $cm^3$.

3. The semiconductor device of claim 1, wherein an electrical resistivity of the negative temperature coefficient of resistance material of the NTC portion of the contact structure changes by at least 50% of its electrical resistivity value at 150° C. in a temperature interval between 170° C. and 250° C.

4. The semiconductor device of claim 1, wherein a maximal thickness of the NTC portion of the contact structure lies between 0.5 μm and 10 μm.

5. The semiconductor device of claim 1, wherein the contact structure further comprises a Schottky or ohmic or positive temperature coefficient contact portion arranged laterally adjacent to the NTC portion of the contact structure.

6. The semiconductor device of claim 1, wherein the electrical device arrangement is a merged pin Schottky diode arrangement, a self-adjusting p-emitter efficiency diode arrangement, an inverse injection dependency of emitter efficiency diode arrangement, a metal oxide semiconductor field effect transistor arrangement, or an insulated gate bipolar transistor arrangement.

7. The semiconductor device of claim 1, wherein the at least one highly doped region forms at least part of a first device doping region of the electrical device arrangement having a first conductivity type.

8. The semiconductor device of claim 7, wherein the first device doping region further comprises a lower doped region laterally surrounding the at least one highly doped region of the first device doping region at the front side surface of the semiconductor substrate.

9. The semiconductor device of claim 8, wherein the lower doped region of the first device doping region has an average doping concentration of less than $1 \times 10^{17}$ dopant atoms per $cm^3$.

10. The semiconductor device of claim 8, wherein the at least one highly doped region of the first device doping region and the lower doped region of the first device doping region have the first conductivity type.

11. The semiconductor device of claim 7, wherein the electrical device arrangement comprises a second device doping region having a second conductivity type, and wherein at least part of the second device doping region is arranged adjacent to a back side surface of the semiconductor substrate.

12. The semiconductor device of claim 11, wherein the second device doping region comprises at least one highly doped region and a lower doped portion laterally surrounding at least one highly doped region at the back side surface of the semiconductor substrate.

13. The semiconductor device of claim 12, wherein the at least one highly doped region of the second device doping region and the lower doped portion of the second device doping region have the second conductivity type.

14. The semiconductor device of claim 12, wherein the second device doping region comprises at least one highly doped region located at the front side surface of the semiconductor substrate.

15. The semiconductor device of claim 12, further comprising a back side contact structure comprising an NTC portion arranged adjacent to the at least one first highly doped region of the second device doping region, and wherein the NTC portion of the back side contact structure comprises a negative temperature coefficient of resistance material.

16. A semiconductor diode, comprising:
    a first cathode/anode region arranged at a first surface of a semiconductor substrate, wherein the first cathode/anode region comprises a highly doped region;
    a second cathode/anode region arranged at a second surface of the semiconductor substrate; and
    a contact structure comprising a NTC portion arranged adjacent to the highly doped region of the first cathode/anode region at the first surface of the semiconductor substrate, the NTC portion comprising a negative temperature coefficient of resistance material,
    wherein the negative temperature coefficient of resistance material of the NTC portion of the contact structure comprises at least one material selected from the group consisting of a chalcogenide material, a phase change material, germanium, germanium-telluride, a metal oxide, a mixture of metal oxides, a mixture of metal oxides and germanium, and a composite material comprising polymer and metal.

17. A semiconductor device, comprising:
a device doping region of an electrical device arrangement formed in a semiconductor substrate, the device doping region comprising a highly doped region and a lower doped region of the same conductivity type, the lower doped region laterally surrounding the highly doped region; and
a contact structure comprising a NTC portion arranged adjacent to the highly doped region at a surface of the semiconductor substrate, the NTC portion comprising a negative temperature coefficient of resistance material,
wherein the negative temperature coefficient of resistance material of the NTC portion of the contact structure comprises at least one material selected from the group consisting of a chalcogenide material, a phase change material, germanium, germanium-telluride, a metal oxide, a mixture of metal oxides, a mixture of metal oxides and germanium, and a composite material comprising polymer and metal.

18. A method for forming a semiconductor device, the method comprising:
forming at least one highly doped region of an electrical device arrangement in a semiconductor substrate; and
forming at least one NTC portion of a contact structure adjacent to the highly doped region of the electrical device arrangement at a front side surface of the semiconductor substrate, the at least one NTC portion comprising a negative temperature coefficient of resistance material,
wherein the negative temperature coefficient of resistance material of the NTC portion of the contact structure comprises at least one material selected from the group consisting of a chalcogenide material, a phase change material, germanium, germanium-telluride, a metal oxide, a mixture of metal oxides, a mixture of metal oxides and germanium, and a composite material comprising polymer and metal.

* * * * *